US012555739B2

(12) United States Patent
Mizumura et al.

(10) Patent No.: US 12,555,739 B2
(45) Date of Patent: Feb. 17, 2026

(54) DIFFERENTIAL PUMPING APPARATUS AND FOCUSED CHARGED PARTICLE BEAM SYSTEM

(71) Applicant: V TECHNOLOGY CO., LTD., Yokohama (JP)

(72) Inventors: Michinobu Mizumura, Yokohama (JP); Toshinari Arai, Yokohama (JP); Takanori Matsumoto, Yokohama (JP); Takuro Takeshita, Yokohama (JP)

(73) Assignee: V TECHNOLOGY CO., LTD., Kanagawa (JP)

( * ) Notice: Subject to any disclaimer, the term of this patent is extended or adjusted under 35 U.S.C. 154(b) by 633 days.

(21) Appl. No.: 17/923,203

(22) PCT Filed: May 31, 2021

(86) PCT No.: PCT/JP2021/020641
§ 371 (c)(1),
(2) Date: Nov. 3, 2022

(87) PCT Pub. No.: WO2022/004229
PCT Pub. Date: Jan. 6, 2022

(65) Prior Publication Data

US 2023/0178335 A1 Jun. 8, 2023

(30) Foreign Application Priority Data

Jun. 29, 2020 (JP) ................................ 2020-111959

(51) Int. Cl.
*H01J 37/317* (2006.01)
*H01J 37/18* (2006.01)
*H01J 37/30* (2006.01)

(52) U.S. Cl.
CPC .......... *H01J 37/3177* (2013.01); *H01J 37/18* (2013.01); *H01J 37/3007* (2013.01)

(58) Field of Classification Search
CPC .......... H01J 37/16; H01J 37/18; H01J 37/301; H01J 37/3007; H01J 37/3177;
(Continued)

(56) References Cited

U.S. PATENT DOCUMENTS 4,528,451 A 7/1985 Petric et al.
4,607,167 A * 8/1986 Petric .................... B82Y 10/00 219/121.22
(Continued)

FOREIGN PATENT DOCUMENTS

CN 107112268 A 8/2017
JP 59-093249 A 5/1984
(Continued)

OTHER PUBLICATIONS

International Search Report for PCT/JP2021/020641 mailed Aug. 17, 2021 with English translation. (7 pp.).
(Continued)

*Primary Examiner* — David E Smith
*Assistant Examiner* — Hsien C Tsai
(74) *Attorney, Agent, or Firm* — LUCAS & MERCANTI, LLP

(57) ABSTRACT

A differential pumping apparatus for creating a high vacuum inside a processing space includes a displacement drive unit configured to move a substrate to be processed or a head, to adjust parallelism and distance between a surface to be processed and a surface of the head. Gap measurement devices are placed at three or more locations along the periphery of the surface of the head to provide distance information. A gap control unit is configured to control the displacement drive unit in response to the distance information between the surface to be processed and the surface adapted to face the surface to be processed, so that the
(Continued)

surface to be processed and the surface adapted to face the surface to be processed are parallel.

19 Claims, 19 Drawing Sheets

(58) Field of Classification Search
CPC ............... H01J 37/3174; H01J 2237/20; H01J 2237/162; H01J 2237/188; H01J 2237/31749
See application file for complete search history.

(56) References Cited

U.S. PATENT DOCUMENTS

| | | | | |
|---|---|---|---|---|
| 4,837,443 | A | 6/1989 | Young et al. | |
| 7,489,389 | B2 | 2/2009 | Shibazaki | |
| 9,244,362 | B2 | 1/2016 | Hazelton et al. | |
| 2002/0109090 | A1 * | 8/2002 | Nakasuji | H01J 37/073 250/311 |
| 2006/0285096 | A1 | 12/2006 | Jacobs et al. | |
| 2007/0070315 | A1 | 3/2007 | Jacobs et al. | |
| 2010/0173432 | A1 | 7/2010 | White et al. | |
| 2010/0245791 | A1 | 9/2010 | Jacobs et al. | |
| 2015/0000055 | A1 | 1/2015 | Togawa et al. | |
| 2015/0000056 | A1 | 1/2015 | Togawa et al. | |
| 2015/0221469 | A1 * | 8/2015 | Miyamoto | H01J 37/16 356/508 |
| 2016/0215396 | A1 | 7/2016 | Khandelwal et al. | |
| 2017/0261312 | A1 | 9/2017 | Khandelwal et al. | |

FOREIGN PATENT DOCUMENTS

| | | | | |
|---|---|---|---|---|
| JP | H01-128525 | A | | 5/1989 |
| JP | 2008-123891 | A | | 5/2008 |
| JP | 5114960 | B2 | | 1/2013 |
| JP | 2014157772 | A | * | 8/2014 |
| JP | 2019-179748 | A | | 10/2019 |
| JP | 2020-031156 | A | | 2/2020 |
| TW | I338198 | B | | 3/2011 |
| TW | I506721 | B | | 11/2015 |
| TW | I674624 | B | | 10/2019 |

OTHER PUBLICATIONS

Written Opinion for PCT/JP2021/020641 mailed Aug. 17, 2021. (5 pp.).

Office Action dated Oct. 3, 2023, for the corresponding Japanese Patent Application No. 2020-111959, with English translation.

Office Action, issued on Feb. 12, 2025, for the corresponding Taiwanese Patent Application No. 110120908, 6 pages, with English translation.

First Office Action, issued on Oct. 26, 2024 for the corresponding Chinese patent application No. 202180029913.4, with English machine translation thereof, 25 pages.

Office Action, dated Jul. 20, 2025, which was issued for the corresponding Korean Patent Application No. 10-2022-7041211, 26 pages, with English machine translation.

* cited by examiner

DIFFERENTIAL PUMPING APPARATUS AND FOCUSED CHARGED PARTICLE BEAM SYSTEM

CROSS-REFERENCE TO RELATED APPLICATION

This application is a 35 U.S.C. 371 National Phase Entry Application of International Patent Application PCT/JP2021/020641, filed May 31, 2021, which claims priority to Japanese Patent Application No. 2020-111959, filed Jun. 29, 2020, the disclosures of which are incorporated herein in their entirety by reference, and priority is claimed to each of the foregoing.

FIELD OF THE INVENTION

The present invention relates to differential pumping apparatuses and focused charged particle beam systems.

BACKGROUND

Focused charged particle beam systems are applicable to focused ion beam systems, electron beam lithography systems, scanning electron microscopes (SEMs), and the like. Focused ion beam systems can observe a microscopic image through detecting of secondary particles (e.g., secondary electrons, secondary ions) emitted from a sample while scanning the surface of the sample, or can process the surface of the sample. More specifically, focused ion beam systems can perform sample observation, etching (sputtering), or CVD (Chemical Vapor Deposition).

Focused ion beam system is applicable to a repair apparatus 100 as shown in FIG. 18. The repair apparatus 100 has a focused ion beam optical system 101, a supply nozzle 102 for supplying a gas for CVD (Chemical Vapor Deposition), a secondary particle detection sensor 103, and a substrate support 105 for supporting a substrate 104 to be repaired, all of which are mounted within a vacuum chamber 106. In the repair apparatus 100, the substrate surface is irradiated with the focused ion beam, the secondary particle detection sensor 103 detects secondary electrons or secondary ions emitted from the substrate, and a microscopic image of the substrate surface is created by finding the two-dimensional distribution among the detected secondary electrons or secondary ions.

In this repair apparatus 100, using the information from the above-mentioned microscopic image, necessary areas on the substrate surface to be repaired are irradiated with the focused ion beam for processing and/or observation. Further, concurrent supply of the gas for CVD from the supply nozzle 102 with the irradiation using the focused ion beam enables localized deposition needed for processing and/or repairing the above-mentioned areas on the substrate surface. A high vacuum needs to be created inside the vacuum chamber 106 to ensure ion straight travel because a low vacuum inside the vacuum chamber 106 leaves residual gas whose molecules collide with the ion beam and hamper ion straight travel.

In recent years, flat panel displays (FPDs), such as liquid crystal displays (LCDs), organic EL displays, are increasing in size. This leads to the need for an increase in volume of the vacuum chamber in the repair apparatus that is described above.

As a conventional technique for solving the above problem, there is disclosed a process apparatus (see, for example, Patent Literature 1) which is provided with a localized exhausting apparatus (also known as a differential pumping apparatus) that locally creates a localized vacuum space on the substrate surface, requiring no vacuum chamber. In this conventional process apparatus, a localized pumping apparatus integral with a focused ion beam lens barrel defines a planar tip which is spaced apart from the substrate, and it can cause the focused ion beam lens barrel to rise away from the substrate.

PRIOR ART

Patent Literature

Patent Literature 1: JP 5114960 B2

SUMMARY OF THE INVENTION

Problems to be Solved

Manufactures use mother glass which is bigger in size to allow them to cut to create multiple panels for their respective FPDs. Increasing the number of panels which can be made from one mother glass is generalized as a way of improving productivity. Mother glass becomes bigger in size, and so its photomask inevitably becomes bigger in size. Speaking of the dimensions of mother glass, a side of mother glass has reached around 3 m recently. As a result, waviness and/or warpage appear in the photomask with increasing in size of mother glass.

FIG. 19 shows processing to repair or fix a large photomask 201 with a repair apparatus 200 which has a localized pumping apparatus 203 mounted to a focused ion beam lens barrel 202 to define a planar head. Because of waviness and/or warpage in the photomask 201, there is an issue that the state of parallelism, in which the planar tip defined by the localized pumping apparatus 203 is separated from the surface of the photomask 201 by a gap, is difficult to maintain against urging force created by air injected. This causes a problem that the localized pumping (or differential pumping) hardly sustains a high vacuum in close proximity to that area of the surface of the photomask 201 which is under the planar tip because of a large difference between a gap G1 by which the nearest point on the periphery of the planar tip is separated from the surface of the photomask 201 and a gap G2 by which the furthest point on the periphery of the planar tip is separated from the surface of the photomask 201. Thus, there is an issue that the surface of the photomask 201 cannot be observed and fixed satisfactorily. Moreover, with the conventional repair device 200, the gap G3 by which the center of the planar tip, through which the optical axis of the focused ion beam lens barrel 202 passes, is separated from the photomask 201 easily fluctuates. Influenced by fluctuation of the gap G3, film forming condition changes, and so, the film becomes non-uniform.

In view of the above-mentioned problem, it is an object of the present invention to provide a differential pumping apparatus capable of sustaining proper differential pumping operation even on a substrate to be processed (e.g., a substrate to be observed, a substrate to be repaired) having warpage and/or waviness, and to provide a focused charged particle beam system capable of conducting good processing.

Means for Solving Problem(s)

In order to solve the above-mentioned problems and achieve the object, an aspect of the present invention is to provide a differential pumping apparatus, comprising: a head movable relative to a surface to be processed of a substrate to be processed to face any area on the surface to be processed, the head having closed-loop grooves in its surface adapted to face the surface to be processed, each of the closed-loop grooves surrounding the center of the surface adapted to face the surface to be processed, the head having, within the area surrounded by the innermost closed-loop groove among the closed-loop grooves, an aperture defining a space for conducting processing of the surface to be processed, the closed-loop grooves including at least one closed-loop groove, to which a vacuum pump is connectable to suck air from the one closed-loop groove to create high vacuum within the space under the condition that the surface of the head faces the surface to be processed; a displacement drive unit configured to move the head or the surface to be processed to adjustably control the parallelism and distance between the surface to be processed and the surface of the head; gap measurement devices placed at least three locations along the periphery of the surface of the head, each of the gap measurement devices being configured to detect the distance between the surface of the head and the surface to be processed and to provide the distance information, and a gap control unit configured to control the displacement drive unit in response to the distance information measured by each of the gap measurement devices so that the surface of the head and the surface to be processed will be parallel to each other with a predetermined distance kept therebetween.

As the above-mentioned aspect, it is preferable that each of the gap measurement devices detects pressure in the space from the gap measurement device to the surface to be processed and provides the pressure information, and the gap control unit controls the displacement drive unit in response to the pressure information.

As the above-mentioned aspect, it is preferable the substrate to be processed has the boundary that is defined by a rectangle having its length and width lying along the X-axis and Y-axis, the head and the substrate to be processed are movable relative to each other along the X-axis and Y-axis; the gap measurement devices are placed at four (4) locations outside the outermost one of the closed-loop grooves, and the gap measurement devices placed at the four locations consists of two pairs of gap measurement devices, the gap measurement devices of one of the two pairs are lined up in a row along the X-axis and separated from the center of the aperture by the same distance in opposite directions, the gap measurement devices of the other pair are lined up in a row along the Y-axis and separated from the center of the aperture by the same distance in opposite directions.

As the above-mentioned aspect, it is preferable that each of the gap measurement units is composed of a laser displacement sensor; and the laser displacement sensor is set back from the surface of the head in a direction away from the surface to be processed to keep a distance to the surface to be processed in the high-precision measurement range in which the laser displacement sensor can work to provide measurements with good accuracy and good precision.

As the above-mentioned aspect, it is preferable that there is an optical microscope configured to detect an alignment mark on the substrate to be processed.

As the above-mentioned aspect, it is preferable that there is an observation microscope, which is installed near the head with an offset-distance, configured to observe the area to be processed on the substrate to be processed.

As the above-mentioned aspect, it is preferable that the outermost closed-loop groove among the closed-loop grooves is connected to a pump for supplying inert gas, and the inert gas is blown through the outermost closed-loop groove to the substrate to be processed to create a curtain of inert gas.

As the above-mentioned aspect, it is preferable that surrounding the entire periphery of the surface of the head, a gas levitator is located outside and integrated with the surface of the head; the gas levitator is connected to a pump, a supply of inert gas, and the gas levitator is configured to blow inert gas to the surface to be processed to create a curtain of gas and to bias the head in a direction away from the surface to be processed.

Another aspect of the present invention is to provide a focused charged particle beam system, comprising: a differential pumping apparatus, including: a head movable relative to a surface to be processed of a substrate to be processed to face any area on the surface to be processed, the head having closed-loop grooves in its surface adapted to face the surface to be processed, each of the closed-loop grooves surrounding the center of the surface adapted to face the surface to be processed, the head having, within the area surrounded by the innermost closed-loop groove among the closed-loop grooves, an aperture defining a space for conducting processing of the surface to be processed, the closed-loop grooves including at least one closed-loop groove, to which a vacuum pump is connectable to suck air from the one closed-loop groove to create high vacuum within the space under the condition that the surface of the head faces the surface to be processed; a focused charged particle beam column, which is on the side of the head opposite to the surface adapted to face the surface to be processed, having a lens barrel, the lens barrel having a focused charged particle beam system built-in for emitting a focused charged particle beam to pass through the aperture; a displacement drive unit configured to move the head or the surface to be processed to adjustably control the parallelism and distance between the surface to be processed and the surface of the head; gap measurement devices placed at least three locations along the periphery of the surface of the head, each of the gap measurement devices being configured to detect the distance between the surface of the head and the surface to be processed and to provide the distance information, and a gap control unit configured to control the displacement drive unit in response to the distance information measured by each of the gap measurement devices so that the surface of the head and the surface to be processed will be parallel to each other with a predetermined distance kept therebetween.

As the above-mentioned another aspect, it is preferable that each of the gap measurement devices detects pressure in the space from the gap measurement device to the surface to be processed and provides the pressure information, and the gap control unit controls the displacement drive unit in response to the pressure information.

As the above-mentioned another aspect, it is preferable that the substrate to be processed has the boundary that is defined by a rectangle having its length and width lying along the X-axis and Y-axis, the head and the substrate to be processed are movable relative to each other along the X-axis and Y-axis; the gap measurement devices are placed at four (4) locations outside the outermost closed-loop groove of the closed-loop grooves, and the gap measurement devices placed at the four locations consists of two pairs of gap measurement devices, the gap measurement devices of one of the two pairs are lined up in a row along the X-axis and separated from the center of the aperture by the same distance in opposite directions, the gap measurement devices of the other pair are lined up in a row along the Y-axis and separated from the center of the aperture by the same distance in the opposite directions.

An the above-mentioned another aspect, it is preferable that each of the gap measurement units is composed of a laser displacement sensor; and the laser displacement sensor is set back from the surface of the head in a direction away from the surface to be processed to keep a distance to the surface to be processed in the high-precision measurement range in which the laser displacement sensor can work to provide measurements with good accuracy and good precision.

As the above-mentioned another aspect, it is preferable that there is an optical microscope configured to detect an alignment mark on the substrate to be processed.

An the above-mentioned another aspect, it is preferable that there is an observation microscope, which is installed near the head with an offset-distance, configured to observe the area to be processed on the substrate to be processed.

As the above-mentioned another aspect, it is preferable that the outermost closed-loop groove among the closed-loop grooves is connected to a pump for supplying inert gas, and the inert gas is blown through the outermost closed-loop groove to the substrate to be processed to create a curtain of inert gas.

As the above-mentioned another aspect, it is preferable that surrounding the entire periphery of the surface of the head, a gas levitator is located outside and integrated with the surface of the head; the gas levitator is connected to a pump, a supply of inert gas, and the gas levitator is configured to blow inert gas to the surface to be processed to create a curtain of gas and to bias the head in a direction away from the surface to be processed.

As the above-mentioned another aspect, it is preferable that there is provided a microchannel plate which has an ion beam passage opening formed through its center, in which its peripheral portion serves as a detection unit for capturing secondary charged particles emanating from the substrate to be processed.

As the above-mentioned another aspect, it is preferable that there are provided focused charged particle beam columns, each of which is the same as the focused energy beam column with the differential pumping apparatus at its tip, each of the focused energy beam columns is arranged to face one of regions into which the substrate to be processed is divided.

As the above-mentioned another aspect, it is preferable that with the substrate to be processed immobile, the XY motion of the focus energy beam with the differential pumping apparatus at its tip is provided.

Technical Effect

According to the present invention, a differential pumping apparatus capable of sustaining proper differential pumping even on a large substrate having warpage and/or waviness, and a focused ion beam system capable of conducting good processing are realized. Because of this, according to the present invention, high vacuum is maintained without fail in the area which the head is formed with, improving the quality of processing in this space.

DETAILED DESCRIPTION

A focused charged particle beam system according to the present invention is applicable to a focus ion beam system used to repair a substrate to be repaired, an electron beam lithography system that can directly write features on a substrate to be processed, a scanning electron microscope that can observe the surface conditions of a substrate to be processed, and the like depending on the type of energy beam to be emitted and on the type of processing on a substrate to be processed. A differential pumping apparatus according to the present invention is applicable to a focused charged particle beam system. In the following description, the focused charged particle beam systems according to embodiments of the present invention will be described as being applied to a focused ion beam system that emits an ion beam to a substrate to be processed.

Referring to the accompanying drawings, differential pumping apparatuses and focused charged particle beam systems according to embodiments of the present invention will be described in detail. It should be noted that the drawings are schematic, so that the dimension, ratio, number, and shape of each element differ from those of the real element. In addition, there are parts or portions in which the dimensional relationship, ratio, and shape are different among the drawings.

First Embodiment (Configuration of Focused Ion Beam System)

Figure 1:
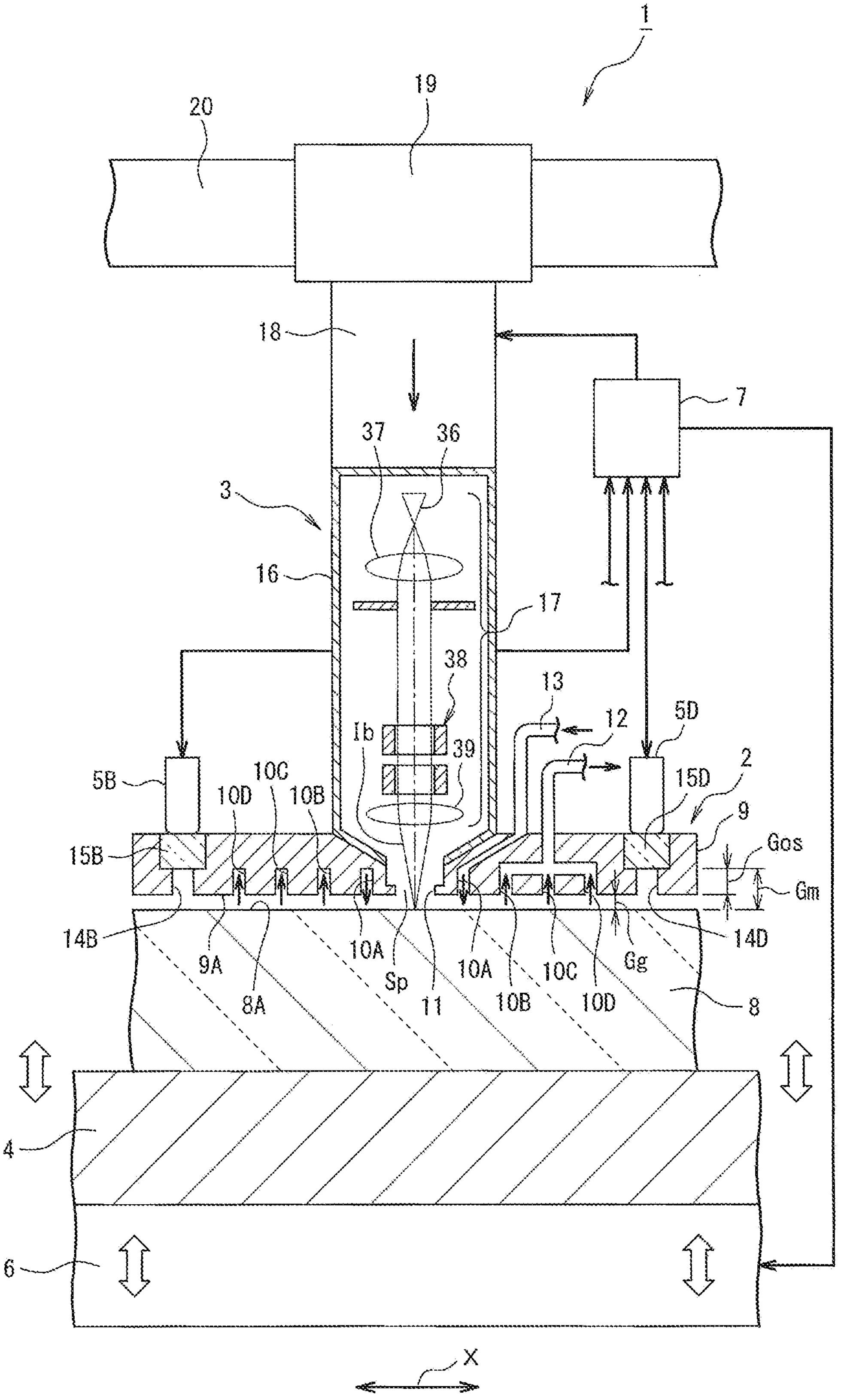
FIG. 1 is an illustration diagram of a cross-section of a focused ion beam system according to a first embodiment of the present invention.

FIG. 1 shows the configuration a focused ion beam system 1 according to the first embodiment. The focused ion beam system 1 has: a differential pumping apparatus 2; a focused charged particle beam column in the form of a focused ion beam (FIB) column 3; a substrate support 4; four gap measurement units in the form of laser displacement sensors 5A, 5B, 5C, and 5D (see FIG. 2); a displacement drive unit 6, and a gap control unit 7.

The substrate support 4 is configured to support a substrate 8 to be processed. In this embodiment, the substrate 8 is a large photomask. The substrate support 4 is a XY motion stage. The displacement drive unit 6 is configured to tilt the substrate support 4 freely. For example, the displacement drive unit 6 may be composed of lift drive units which support the substrate support 4 at multiple locations (i.e., at four corners of the substrate support 4). The lift drive units are energized to adjustably raise or lower the four corners of the substrate support 4 to tilt the substrate 8 to a desired tilted condition.

Configuration of Differential Pumping Apparatus

Figure 2:
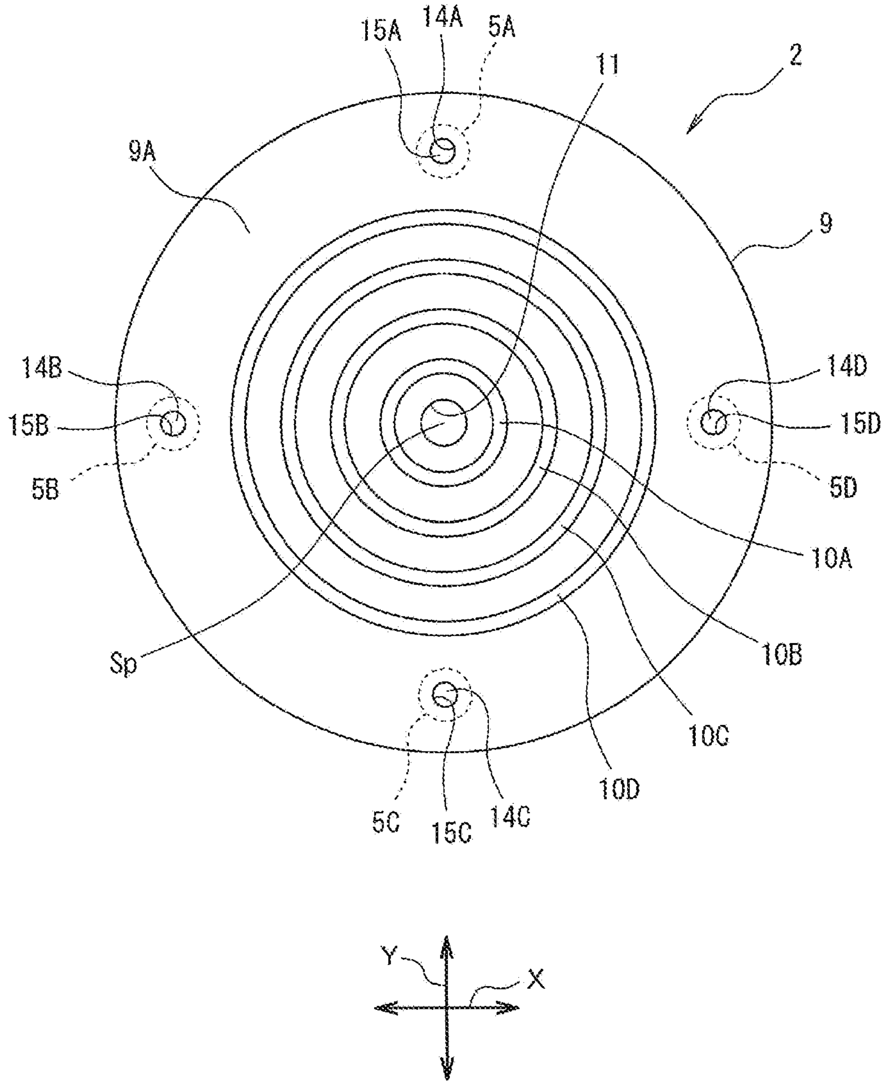
FIG. 2 is a bottom view of a differential pumping apparatus of the focused ion beam system according the first embodiment of the present invention.

The configuration of the differential pumping apparatus 2 will be described below with reference to FIGS. 1 and 2. FIG. 2 is a bottom view of the differential pumping apparatus 2. The differential pumping apparatus 2 includes a head 9, a vacuum pump, and a delivery pump, which pumps are not shown.

The head 9 is composed of a metal disc, whose area is small as compared to the surface 8A to be processed. The substrate support 4 is moveable in "X" and "Y" direction, and so, the head 9 can face any area of the surface 8A to be processed.

As shown in FIG. 2, that surface 9A, i.e., the bottom surface 9A, of the head 9 which is adapted to face the surface 8A to be processed is formed with concentrically arranged four closed-loop grooves 10A, 10B, 10C, and 10D. At an area surrounded by the innermost closed-loop groove 10A among the concentrically arranged closed-loop grooves 10A, 10B, 10C, and 10D, the head 9 has an aperture 11 which defines a space "Sp" for conducting processing, ion-beam-induced deposition, of the surface 8A to be processed of the substrate 8. The FIB column 3, which will be described later, is coupled to, and communicates with the aperture 11. In this description, each of the grooves surrounding the center of the head 9 is referred to as "a closed-loop groove", but the term "a closed-loop groove" is herein used to mean a circular loop-shaped groove, a square loop-shaped groove, a loop which is partially lost, such as, a C-shaped groove, grooves intermittently lined in a loop, and the like.

Among the closed-loop grooves 10A, 10B, 10C, and 10D, one or more (three in this embodiment) closed-loop grooves 10B, 10C, and 10D are connected to vacuum pumps (not shown) through connecting tubes 12. The innermost closed-loop groove 10A is connected to a deposition gas supply (not shown), which is a supply source of a gas for deposition (e.g., a deposition gas, a CVD gas), through a connecting tube 13. With the surface 9A facing the surface 8A of the substrate 8, the head 9 sucks air through the closed-loop grooves 10B, 10C, and 10D to create high vacuum within the space Sp. Further, the head 9 ensures a reliable supply of the gas for deposition to the space Sp, which is regulated to the required high vacuum level in the above-mentioned way, from the innermost closed-loop groove 10A, enabling film formation with CVD on the surface 8A to be processed underneath the aperture 11.

With the surface 9A of the head 9 and the surface 8A of the substrate 8 being kept parallel and close to each other within the same area, a real gap Gg, on the order of about 30 microns (μm), is defined between the surface 9A and the surface 8A, and so the high vacuum condition in the space Sp is not broken and the internal high vacuum is sustained. The localized vacuum condition created by differential pumping is not sustained in the area where a portion of the periphery of the head 9 is separated from the surface 8A of the substrate 8 and the gap exceeds, for example, 40 microns (μm) if the head 9 is tilted with respect to the surface 8A of the substrate 8.

As shown in FIG. 2, at four locations near the periphery of the surface 9A and in the outer region of the outermost closed-loop groove 10D, the head 9 is formed with light-transmissive openings 14A, 14B, 14C, and 14D.

Transparent light-transmissive plates 15A, 15B, 15C, and 15D are embedded into light-transmissive openings 14A, 14B, 14C, and 14D, respectively, from the distal ends of the openings toward the surface 9A.

Laser Displacement Sensor

Using a combination of a light-projecting element (not shown) and a linear image sensor (not shown), each of the laser displacement sensors 5A, 5B, 5C, and 5D measures range (or detects displacement). It is known that a measurement taken by each of the laser displacement sensors of a displacement value of 30 microns (μm) or less has good accuracy, but poor precision.

In this embodiment, the laser displacement sensors 5A, 5B, 5C, and 5D are arranged on the tops of the transparent light-transmissive plates 15A, 15B, 15C, and 15D, respectively. Each of the laser displacement sensors 5A, 5B, 5C, and 5D is configured to measure the distance (referred to as a management gap) Gm between the bottom of the associated one of the transparent light-transmissive plates 15A, 15B, 15C, and 15D and the surface 8A of the substrate 8 through the associated one of the transparent light-transmissive openings 14A, 14B, 14C, and 14D. Subtracting an offset gap Gos, i.e., the distance from the surface 9A to the associated one of the transparent light-transmissive plates 15A, 15B, 15C, and 15D, from the management gap Gm taken by the associated one of the laser displacement sensors 5A, 5B, 5C, and 5D gives a measurement of an actual gap Gg defined between the surface 9A of the head 9 and the surface 8A to be processed of the substrate 8 at a measurement-point where the laser displacement sensor 5A, 5B, 5C, or 5D is placed. A measurement taken by each of the laser displacement sensors 5A, 5B, 5C, and 5D of the management gap Gm is longer than 30 microns (μm), and so this measurement has good accuracy and good precision.

Focused Ion Beam Column: FIB Column

The FIB column 3 is on the other side of the head 9 or near the surface (i.e., the top surface) opposite to the surface 9A, and is coupled to the head with its tip portion inserted into the aperture 11.

The FIB column 3 includes a lens barrel 16 communicating with the space Sp, and a focused ion beam (FIB) optical system 17 mounted in the lens barrel 16. An ion beam Ib exits from the tip of the FIB column 3 in a direction toward the surface 8A of the substrate 8 passing through the aperture 11. In this embodiment, the tip of the lens barrel 16 tapers.

The FIB optical system 17 includes an ion source 36 for the emission of an ion beam Ib, a condenser lens 37 for converging the ion beam Ib, a deflector 38 for scanning the ion beam Ib, an objective electrostatic lens 39 for focusing the ion beam Ib, and the like. As the ion source 36, gallium (Ga) ion source is used, but noble gas ion source, using an inductively coupled plasma (ICP) with noble gas like argon (Ar) or gas electrolytic ionization, may be used. Field lenses are good as the lenses for the ion beam Ib.

Tungsten hexacarbonyl ($W(CO)_6$) is used as a deposition gas in CVD. When a precursor gas of tungsten hexacarbonyl $W(CO)_6$ near a substrate is irradiated with a focused ion beam, it is decomposed into W and CO, leading to deposition of W on the substrate.

Lift means 18 for raising and lowering the FIB column 3 and differential pumping apparatus 2 is mounted to the top of the FIB column 3. The top of the lift means 18 is supported by a support 19 at a support frame 20. The lift means 18 raises or lower the FIB column 3 and differential pumping apparatus 2 to separate the focused ion beam system 1 from the substrate 8. In this embodiment, the lift means 18 is mounted to the top of the FIB column 3, but the support frame 20 may feature such lift technology.

Gap Control System

The gap control system 7 receives measurements of the management gap Gm (distance information) taken by the laser displacement sensors 5A, 5B, 5C, and 5D and provides drive control signals to the displacement drive unit 6 until real values of the actual gap Gg between the surface 9A and the surface 8A at those equally distributed locations within the surface 9A of the head 9 where the laser displacement sensors 5A, 5B, 5C, and 5D are placed express the parallel relationship between the surface 9A and the surface 8A.

Control and Behavior of Focused Ion Beam System According to First Embodiment

Figure 3:
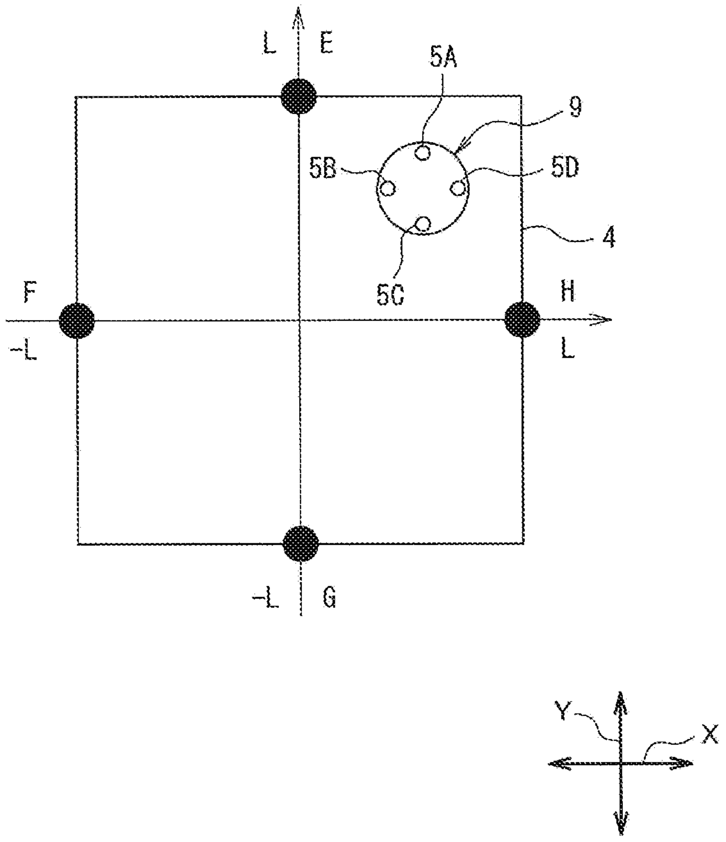
FIG. 3 is an illustration diagram of the two-dimensional relationship between a head and a substrate support, which are used in the focused ion beam system according to the first embodiment of the present invention.

The following describes actions taken by the focused ion beam system 1, according to this embodiment, for bringing a limited area within the surface 8A of the substrate 8 into a parallel relationship with the surface 9A of the head 9 with a predetermined gap kept therebetween. Referring to FIG. 3, in the displacement drive unit 6 according to this embodiment, four displacement drive units (indicated by E, F, G, and H) are right underneath the substrate support 4. The four displacement drive units E, F, G, and H are arranged in a square shape and at locations indicated by black dots. Let us assume that the length of the diagonal of this square is 2 L. Let us assume that the length and the width of a rectangle that define the boundary of the substrate support 4 are lying along the X-axis and Y-axis. The laser displacement sensors 5A, 5B, 5C, and 5D are arranged as shown in FIG. 2. In detail, four laser displacement sensors 5A, 5B, 5C, and 5D are arranged on a circle having a radius r, which circle is concentric with a circular edge of the head 9. Here, the coordinates of the center of the head 9 are (hx, hy), and the radius of the head 9 is "r".

Figure 4:
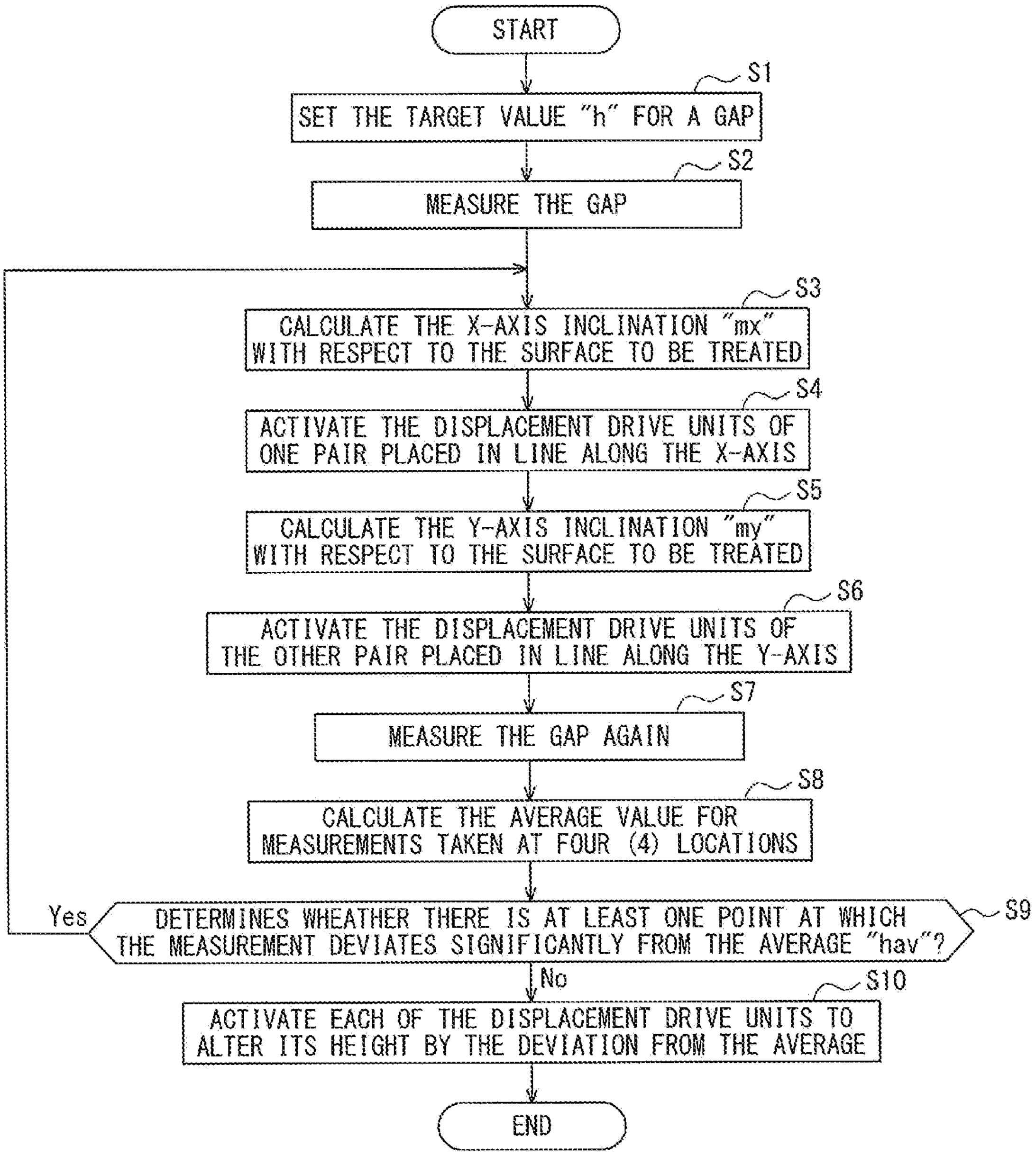
FIG. 4 is a flowchart for the focused ion beam system according to the first embodiment of the present invention.

Referring, next, to the flowchart shown in FIG. 4, the control and behavior of the focused ion beam system 1 is described. The control described below is applicable in cases of observation, etching (sputtering), and CVD (chemical vapor deposition).

First, the substrate 8 is placed on the substrate support 4 in the focused ion beam system 1, and it is moved until the area scheduled to be processed is located underneath the head 9. Under this condition, the gap control system 7 activates the lift means 18 to raise the surface 9A of the head unit 9 to a predetermined height above the surface 8A to be processed.

Next, control is as follows:

(1) A target value "h" for a gap between the surface 8A to be processed and the surface 9A adapted to face the surface 8A to be processed is set (step S1).

(2) Using the laser displacement sensors 5A, 5B, 5C, and 5D, a measurement of a gap between each of the laser displacement sensors 5A. 5B, 5C, and 5D and the surface 8A is taken (step S2). Let these measurements be "hA," "hB," "hC," and "hD," respectively.

(3) The inclination "mx" of the head 9 with respect to the surface 8A (i.e., an angle formed between a straight line parallel to X-axis and on the surface 9A of the head 9 and its orthogonal projection on the surface 8A underneath the head 9) can be expressed by the following formula (step S3).

$$mx=(hD-hB)/2r$$

(4) The displacement drive unit F and the displacement drive unit H, which are in line along X-axis, are activated to alter their heights by their respective values (step S4), which can be expressed by the following formulas, respectively.

$$\Delta hF=-(L+hx)mx$$

$$\Delta hH=(L-hx)mx$$

(5) The inclination "my" of the head 9 with respect to the surface 8A (i.e., an angle formed between a straight line parallel to Y-axis and on the surface 9A of the head 9 and its orthogonal projection on the surface 8A underneath the head 9) can be expressed by the following formula (step S5).

$$My=(hA-hC)/2r$$

(6) The displacement drive unit A and the displacement drive unit C, which are in line along Y-axis, are activated to alter their heights by their respective values (step S6), which can be expressed by the following formulas, respectively $$\Delta hA=(L-hy)my$$

$$\Delta hC=-(L+hy)my$$

(7) Using the laser displacement sensors 5A, 5B, 5C, and 5D, a measurement of a gap between each of the laser displacement sensors 5A. 5B, 5C, and 5D and the surface 8A is taken again (step S7). Let these measurements be "hA," "hB," "hC," and "hD."

(8) The average "hav" is found by calculating the sum of a set of measurements of the gap taken at four (4) locations by four (4) laser displacement sensors 5A, 5B, 5C and 5D and dividing the sum of the measurements by the number of the data (four (4) in this embodiment), and then a deviation ("h−hav") of each of the measurements "hA," "hB, "hC," and "hD" from the average "hav" is found (step S8).

If all of the deviations contain a significant amount of deviation at any one point (measurement point), that is, if there is at least one point at which the measurement deviates significantly from the average "hav," the control returns to step S3 (step S9).

(9) In step S9, if the deviation from the average "hav" at each point is small, each of the displacement drive units E, F, G, and H is activated to alter its height by the deviation from the average "h−hav," and the control ends (step S10).

As described, the gap control system 7 controls the displacement drive units E, F, G, and H using the measurements taken by the laser displacement sensors 5A, 5B, 5C, and 5D. In the focused ion beam system 1, such control is performed when the limited area of the surface 8A and the surface 9A of the head 9 have faced each other subsequent to movement of the substrate 8.

Technical Effect(s) Provided by Focused Ion Beam System According to First Embodiment The focused ion beam system 1 according to the first embodiment of the present invention can keep the actual gap Gg at a desired value while keeping a face-to-face relation between the surface 8A and the head 9 even though the substrate 8, such as a photomask, grows in size with occurrence of waviness and/or warpage on its surface 8A.

Even though the substrate 8 moves relative to the head 9, the substrate 8 can maintain its face-to-face relation with the surface of 9A of the head 9 while it follows the head 9. This keeps stable vacuum conditions between the head 9 and the surface 8A because it prevents breakage of vacuum conditions near the periphery of the head 9. Thus, repair, such as deposition with CVD, in the space Sp is ensured.

Further, in the focused ion beam system 1 according to this embodiment, the laser displacement sensors 5A, 5B, 5C, and 5D are arranged in such a way that the line interconnecting the laser displacement sensor 5A and the laser displacement sensor 5C is orthogonal to the line interconnecting the laser displacement sensor 5B and the laser displacement sensor 5D. That is, a group of the four laser displacement sensors 5A, 5B, 5C, and 5D consists of two pairs, one pair consisting of two laser displacement sensors which are separated from the center of the aperture 11 in the opposite directions along the X-axis by the same distance, the other pair consisting of the other two laser displacement sensors which are separated from the center of the aperture 11 in the opposite directions along the Y-axis by the same distance.

Even though the head 9 is located on the edge of the surface 8A to be processed after movement of the substrate 8 in X and Y direction, and so one of the four laser displacement sensors is deviated from the surface 8A, as long as there remain three laser displacement sensors which face the surface 8A to be processed, the above-mentioned arrangement ensures the before mentioned displacement drive control using the measurement values taken by the three laser displacement sensors. Accordingly, this focused ion beam system 1 can keep on processing even on the side edge of the substrate 8. In other words, this focused ion beam system 1 can effectively process a wide range of the substrate 8.

In the focused ion beam system 1 according to this embodiment, each of the laser displacement sensors 5A, 5B, 5C, and 5D is set back from the surface 9A of the head 9 in a direction away from the surface 8A to be processed to keep a distance to the surface 8A in the high-precision measurement range in which the laser displacement sensors 5A, 5B, 5C, and 5D can work to provide measurements with good accuracy and good precision. Using such high-precision measurements taken by the laser displacement sensors 5A, 5B, 5C, and 5D, the values of the substantial gap Gg between the surface 8A and the surface 9A at the locations of the laser displacement sensors 5A, 5B, 5C, and 5D are given with good accuracy and good precision.

In this embodiment, the lens barrel 16 tapers toward the tip, making it possible to put the innermost closed-loop groove 10A within the surface 9A of the head 9 of the differential pumping apparatus 2 closer to the ion beam Ib. This arrangement ensures the conduction of deposition gas to the space Sp, making it possible to certainly fabricate a stable thin film with CVD. Further, tapering the tip portion of the lens barrel 16 makes it possible to put the closed-loop grooves 10A, 10B, 10C, and 10D closer to the vicinity of the small aperture 11, making the differential pumping apparatus 2 smaller.

Modification 1 of First Embodiment

Figure 5:
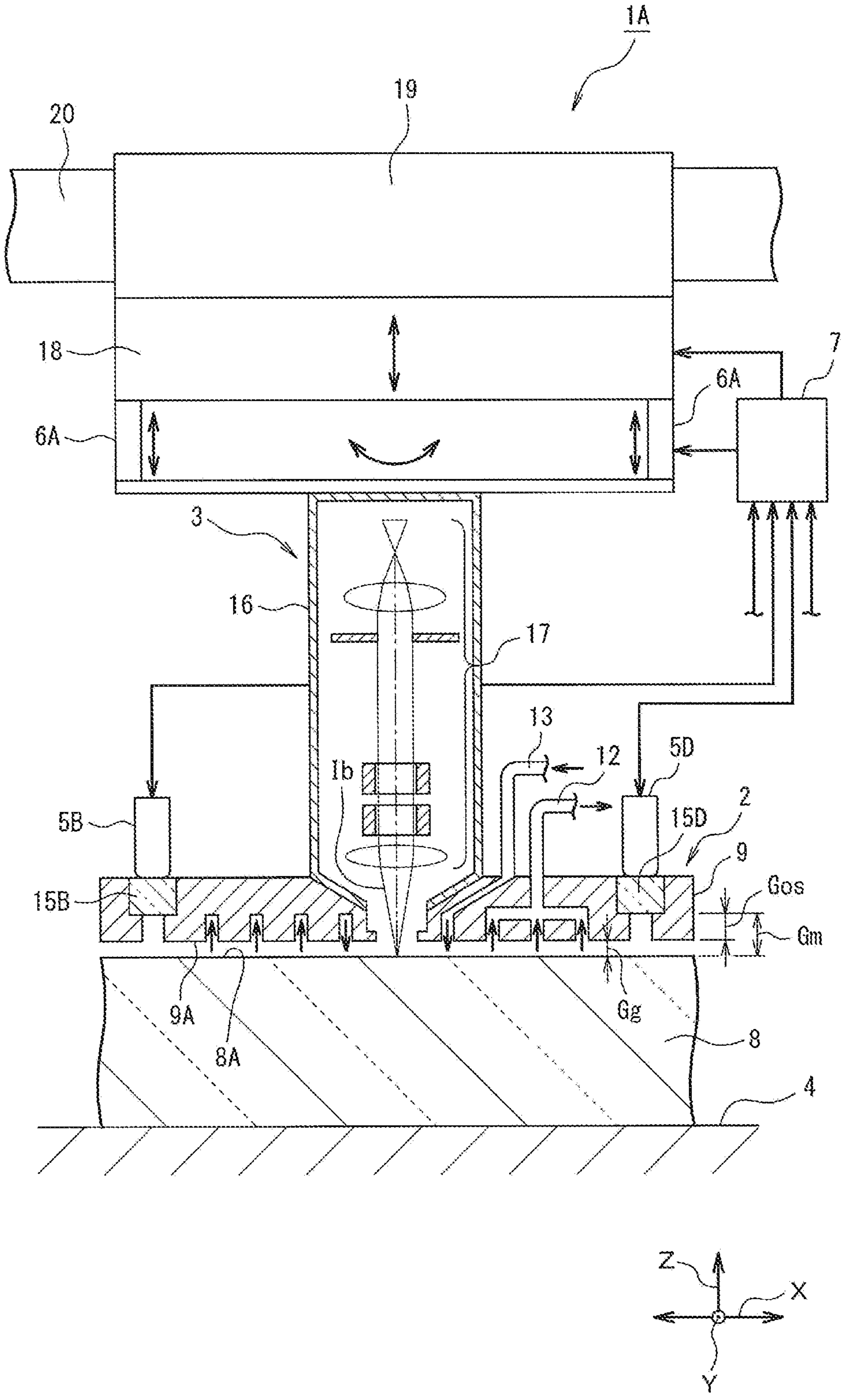
FIG. 5 is an illustration diagram of a cross-section of a focused ion beam system implementing a modification 1 of the first embodiment of the present invention.

A focused ion beam system 1A shown in FIG. 5 implements modification 1 of the above-mentioned focused ion beam system 1 according to the first embodiment. This focused ion beam system 1A has four displacement drive units 6A on the top of a FIB column 3. These four displacement drive units 6A are incorporated in a FIB column hanger which is above and holds the FIB column 3. The hanger has a lift means 18, which is similar to that used in the first embodiment, provided on the upper portions of the displacement drive units 6A. The four displacement drive units 6A are right above the laser displacement sensors 5A, 5B, 5C, and 5D, respectively.

The displacement drive units 6A are arranged and configured to tilt the FIB column 3 and the associated differential pumping apparatus 2, serving as means for tilting the FIB column 3 together with its associated differential pumping apparatus 2. In this modification 1, the four displacement drive units 6A provided near the FIB column 3 are activated to adjust the relationship between the surface 9A adapted to face the surface 8A to be processed to keep them in parallel, eliminating the need for the displacement drive units 6 provided near the substrate support 4 as in the first embodiment.

Control and Behavior of Modification 1 of First Embodiment (1) A target value "h" for a gap between the surface 8A to be processed and the surface 9A adapted to face the surface 8A is set.

(2) Using the laser displacement sensors 5A, 5B, 5C, and 5D, a measurement of a gap between each of the laser displacement sensors 5A. 5B, 5C, and 5D and the surface 8A is taken. Let these measurements be "hA," "hB," "hC," and "hD," respectively.

(3) The inclination "mx" of the head 9 with respect to the surface 8A (i.e., an angle formed between a straight line parallel to X-axis and on the surface 9A of the head 9 and its orthogonal projection on the surface 8A underneath the head 9) can be expressed by the following formula.

$$mx=(hD-hB)/2r$$

(4) The displacement drive units 6A of a pair, which are in line along X-axis, are activated to alter their heights by their respective values, which can be expressed by the following formulas, respectively.

$$\Delta hF=-(L+hx)mx$$

$$\Delta hH=(L-hx)mx$$

(5) The inclination "my" of the head 9 with respect to the surface 8A (i.e., an angle formed between a straight line parallel to Y-axis and on the surface 9A of the head 9 and its orthogonal projection on the surface 8A underneath the head 9) can be expressed by the following formula.

$$my=(hA-hC)/2r$$

(6) The displacement drive units 6A of the other pair, which are in line along Y-axis, are activated to alter their heights by their respective values, which can be expressed by the following formulas, respectively $$\Delta hA=(L-hy)my$$

$$\Delta hC=-(L+hy)my$$

(7) Using the laser displacement sensors 5A, 5B, 5C, and 5D, a measurement of a gap between each of the laser displacement sensors 5A. 5B, 5C, and 5D and the surface 8A is taken again. Let these measurements be "hA," "hB," "hC," and "hD."

(8) The average "hav" is found by calculating the sum of a set of measurements of the gap taken at four (4) locations by four (4) laser displacement sensors 5A, 5B, 5C and 5D and dividing the sum of the measurements by the number of the data (four (4) in this embodiment), and then a deviation ("h−hav") of each of the measurements "hA," "hB, "hC," and "hD" from the average "hav" is found.

If all of the deviations contain a significant amount of deviation at any one point (measurement point), that is, if there is at least one point at which the measurement deviates significantly from the average "hav," the control returns to the control returns to the above-mentioned process (3).

(9) If, in the above-mentioned process (8), the deviation from the average "hav" at each point is small, each of the displacement drive units E, F, G, and H is activated to alter its height by the deviation from the average "h−hav," and the control ends.

The focused ion beam system 1A labelled modification 1 is the same as the focused ion beam system 1 according to the first embodiment in the other aspects of its configuration and its effectiveness.

In this modification 1, the four displacement drive units 6A are provided right above the four laser displacement sensors 5A, 5B, 5C, and 5D, respectively, but three displacement drive units 6A may be provided right above three laser displacement sensors, respectively.

If, in this way, only three laser displacement sensors are provided, what one should do is to conduct the following control. First, a target value "h" of a gap between the surface 9A and the surface 8A is set. Next, using the laser displacement sensors 5A, 5B, and 5C, a measurement of a gap between each of the laser displacement sensors 5A. 5B, and 5C and the surface 8A is taken. Let these measurements be "hA," "hB," and "hC," respectively. The displacement drive units are activated to alter their heights by the values "h−hA," "h−hB," and "h−hC," respectively. Finally, with the laser displacement sensors 5A, 5B, and 5C, a measurement of a gap between each of the laser displacement sensors 5A. 5B, and 5C and the surface 8A is taken and confirmed.

Modification 2 of First Embodiment

Figure 6:
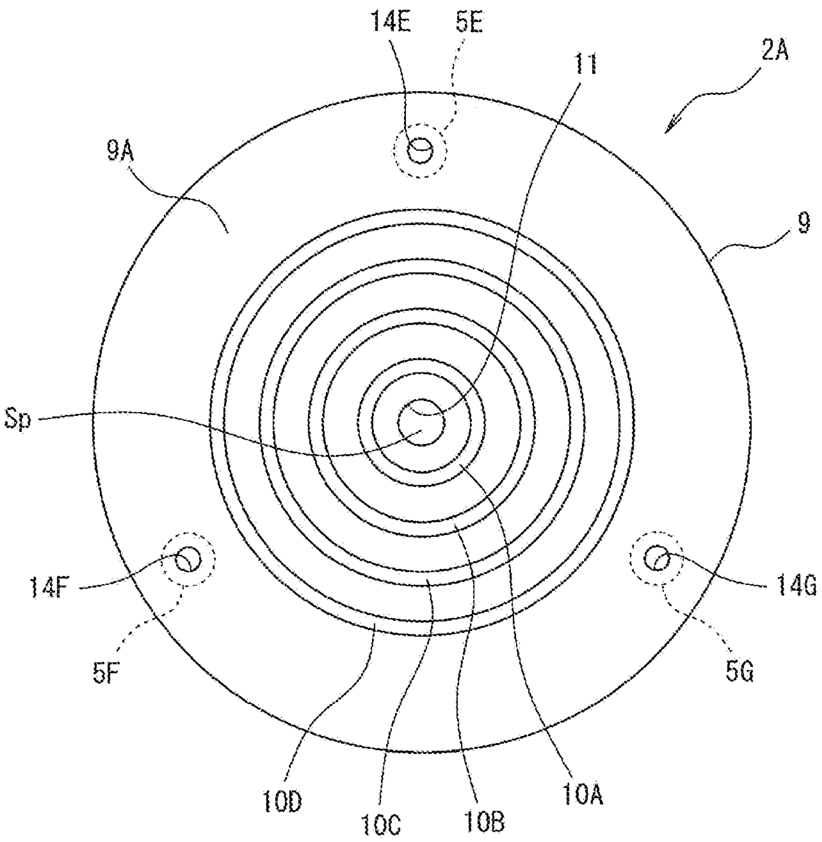
FIG. 6 is a bottom view of a differential pumping apparatus of a focused ion beam system implementing a modification 2 of the first embodiment of the present invention.

FIG. 6 is a bottom view of a differential pumping apparatus 2A which implements modification 2 of the first embodiment of the present invention. The differential pumping apparatus 2A has three light-transmissive openings 14E, 14F, and 14G, which are drilled through a head 9 at three angularly equidistant locations on a circle near the periphery of the head 9, and three laser displacement sensors 5E, 5F, and 5G, which correspond to the light-transmissive openings 14E, 14F, and 14G, respectively.

Even in the differential pumping apparatus 2A, which implements the modification 2, displacement drive control is conducted to keep the surface 9A and the surface 8A parallel using measurements of a management gap Gm at three points taken by the three laser displacement sensors 5E, 5F, and 5G. In the differential pumping apparatus and the focus ion beam system, the head 9 just has to have laser displacement sensors at three or more locations as gap measurement devices.

Modification 3 of First Embodiment

Figure 7:
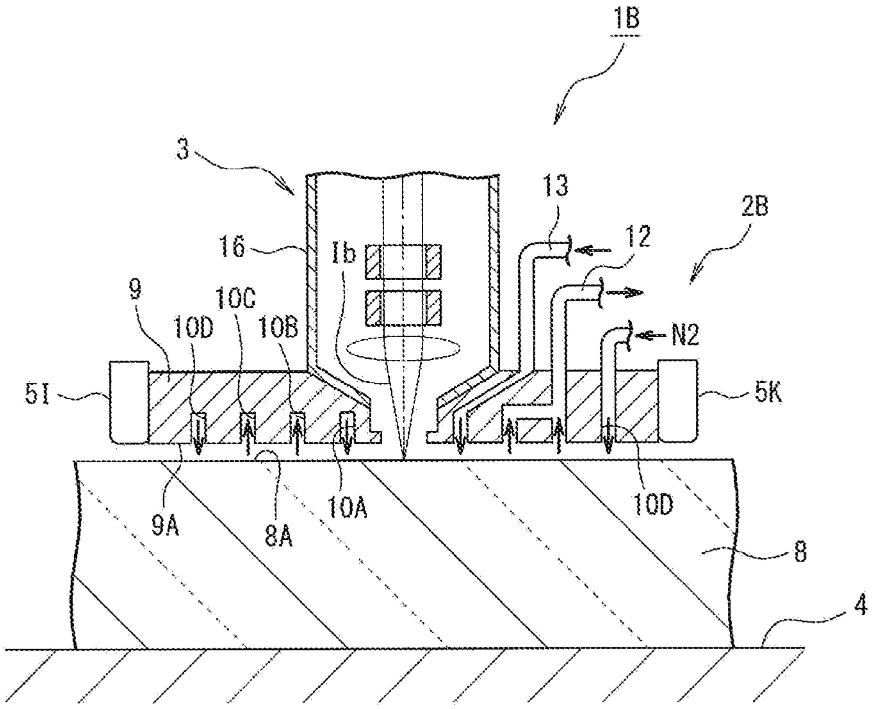
FIG. 7 is the cross-section exposed when cut through along the plane indicated by the plane line VII-VII in FIG. 8, showing a main part of a focused ion beam system implementing a modification 3 of the first embodiment of the present invention.
Figure 8:
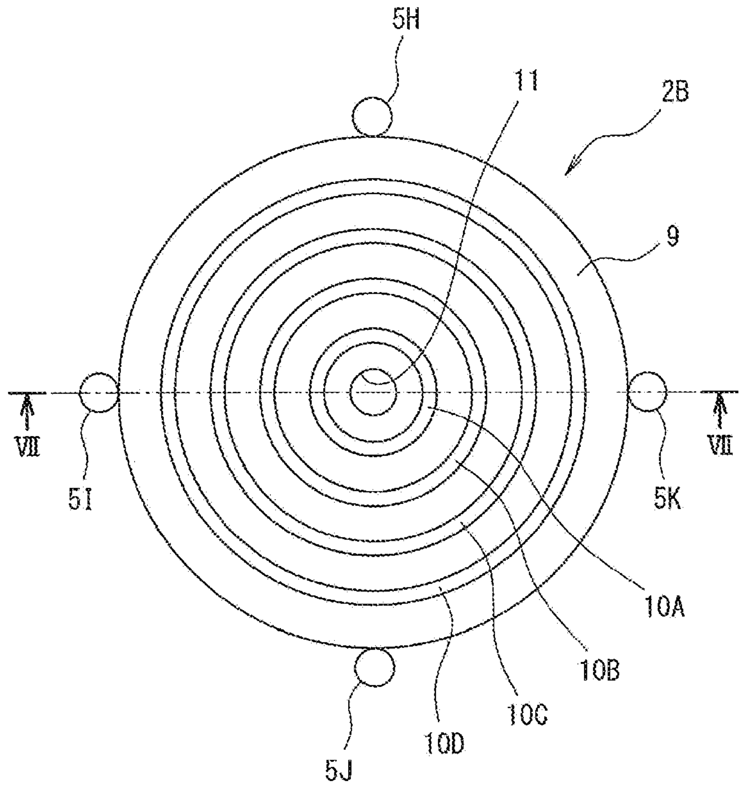
FIG. 8 is a bottom view of a differential pumping apparatus of the focused ion beam system implementing the modification 3 of the first embodiment of the present invention.

FIGS. 7 and 8 show a focused ion beam system 1B implementing modification 3 of the first embodiment. FIG. 7 is a sectional view of the plane indicated by the broken line VII-VII in FIG. 8. FIG. 8 is a bottom view of a differential pumping apparatus 2B implementing the modification 3. In this modification 3, without placing laser displacement sensors with their sensor tips staying back as in the focused ion beam system 1 according to the first embodiment, laser displacement sensors are placed on the periphery of a head 9 with their sensor tips put on the same level as the surface 9A of the head 9. The laser displacement sensors 5H, 5I, 5J, and 5K are used in the modification 3, but the gap measurement devices may take other type of gap sensors.

In the modification 3 also, the inert gas in the form of nitrogen gas (N2) is blown through the outermost closed-loop groove 10D of the head 9 to the surface 8A to be processed, creating a curtain of inert gas. Using the inert gas in this way makes it possible to purge the inside of the lens barrel 16 with the inert gas, contributing to improvement of environment. Further, since the inert gas is blown, the head 9 is biased in a direction away from the surface 8A and rises. Thus, this modification 3 is effective to offset the vacuum created by the differential pumping.

Modification 4 of First Embodiment

Figure 9:
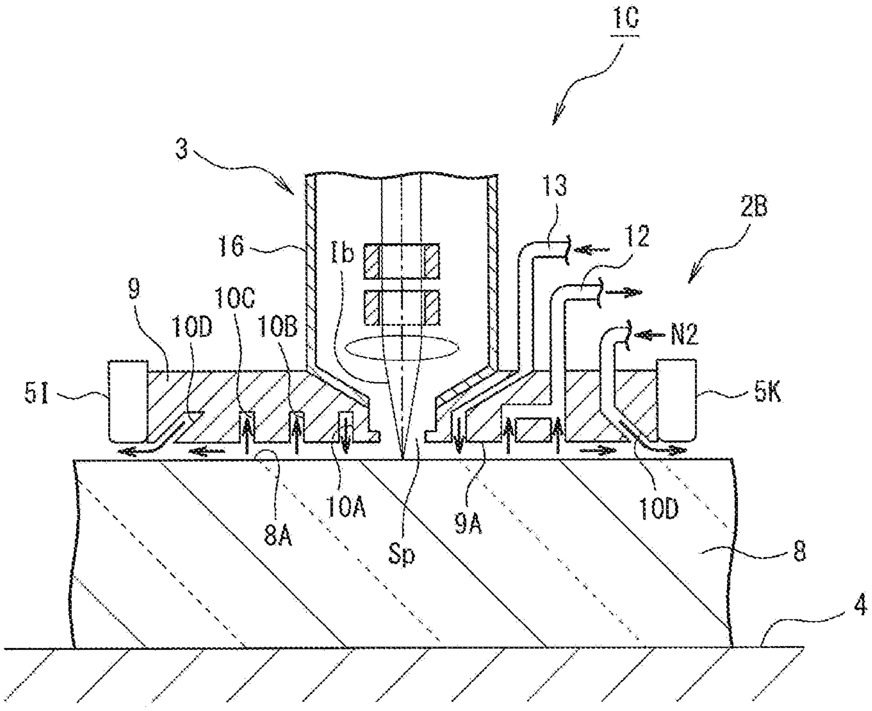
FIG. 9 is an illustration diagram of the cross-section of a main part of the focused ion beam system according to the first embodiment of the present invention.

FIG. 9 shows a focused ion beam system 1C implementing modification 4 of the first embodiment.

In accordance with this modification, the discharge angle is adjusted so that the dry nitrogen gas (N2) leaving the outermost closed-loop groove 10D of the head 9 will have enough horizontal outward force. The closed-loop groove 10D is formed to achieve optimum discharge angle. The setting of the discharge pressure is such that the nitrogen gas (N2) will be accelerated and forced to leave the closed-loop groove 10D at satisfactory high velocity.

Thus, the nitrogen gas (N2) leaving the closed-loop groove 10D is discharged into the atmosphere at high velocity, causing inside gas near a space Sp to be blown outside. The nitrogen gas (N2) at high velocity prevents outside air from entering the space Sp and causes the gas molecules inside the space Sp to be blown outside, so achieving a higher vacuum inside the space Sp.

Moreover, in the modification 4, the dry nitrogen gas forced to leave the outermost closed-loop groove 10D at high velocity reduces infiltration of water inside the space Sp. Since inert gas in the form of nitrogen gas (N2) is blown to the surface 8A to create a curtain of inert gas, purging the inside of the lens barrel 16 with the inert gas is made possible, contributing to improvement of environment. Further, since the inert gas is blown, the head 9 is biased in a direction away from the surface 8A and it is raised. Thus, even in this modification 4, the vacuum created by the differential pumping is offset.

Modification 5 of First Embodiment

Figure 10:
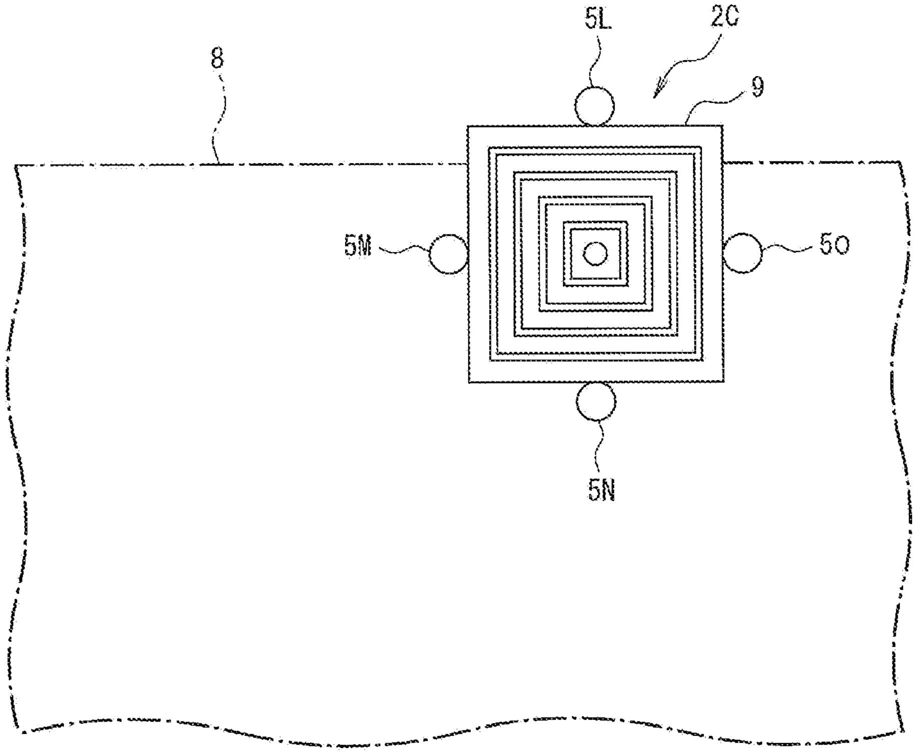
FIG. 10 is an illustration diagram of the bottom of a differential pumping apparatus of a focused ion beam system implementing a modification 5 of the first embodiment of the present invention.

FIG. 10 shows a differential pumping apparatus 2C for focused ion beam systems, which apparatus implements modification 5 of the first embodiment. One dot chain lines in FIG. 10 indicate a portion of a substrate 8 to be processed. In the modification 5, a head 9 has a square planar shape, and it is equipped with four laser displacement sensors 5L, 5M, 5N, and 5O each of which is attached from outside to the midpoint of the associated one of its four sides.

In this modification 5, even though the head 9 is located on the edge of the substrate 8 after movement of the substrate 8 in X and Y direction, and so one of the four laser displacement sensors is deviated from the substrate 8, as long as there remain three laser displacement sensors which face the substrate 8, the above-mentioned arrangement ensures the before mentioned displacement drive control using the measurements taken by the three laser displacement sensors. Accordingly, the differential pumping apparatus can keep on processing even on areas near the sides of the substrate 8.

Second Embodiment

Figure 11:
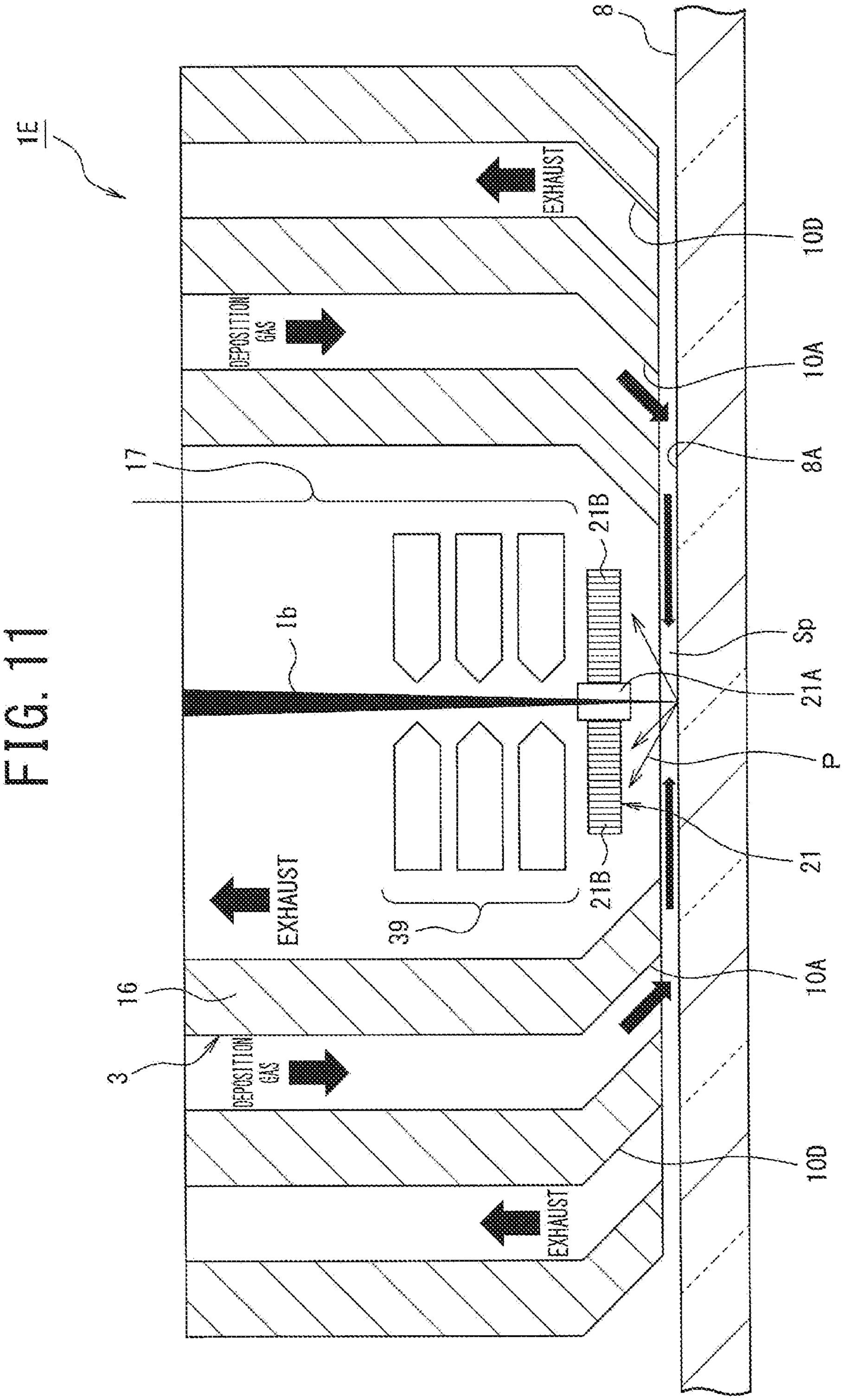
FIG. 11 is an illustration diagram schematically showing a focused ion beam system according to a second embodiment of the present invention.

FIG. 11 is an illustration diagram schematically showing a focused ion beam system 1E according to a second embodiment of the present invention. Although laser displacement sensors or the like are not shown in FIG. 11, the focused ion beam system 1E as well as the focused ion beam system 1 according to the first embodiment has laser displacement sensors or the like as gap measurement devices. Further, in FIG. 11, the closed-loop grooves are simplified by eliminating all except two closed-loop grooves, one closed-loop groove 10A for intake, the other closed-loop groove 10D for exhaust.

In detail, this embodiment has, within the tip portion of a lens barrel 16, an objective electrostatic lens 17A of a focused ion beam optical system 17 and a microchannel plate 21. The microchannel plate 21 is placed within the downstream, with respect to the flow of the ion beam, area of the objective electrostatic lens 17A (or placed at a position near the tip end of the lens barrel 16). As shown in FIG. 11, the microchannel plate 21 has an ion beam passage opening 21A formed through its center, in which its peripheral portion serves as a detection unit 21B for capturing secondary charged particles P emanating from a substrate 8 to be processed.

With the deposition-gas supply being suspended, the surface 8A of the substrate 8A is irradiated with the ion beam Ib during observation of the surface 8A of the substrate 8 using the focused ion beam system 1E. Incident secondary charged particles P emanating from the surface 8A onto which the ion beam Ib impinges causes the production of more electrons in the detection unit 21B. The production of more electrons in this way leads to electric current multiplication that can allow large avalanche current, providing information about conditions of the surface 8A. Thus, the focusing energy beam system 1E according to this embodiment can detect conditions of the surface 8A with a high degree of sensitivity.

The focused ion beam system 1E according to this embodiment allows the objective electrostatic lens 17A to approach more closely the substrate 8 to shorten the working distance (WD), and so, it improves the efficiency of secondary charged particle P capture as compared to the conventional method for detecting secondary charged particles with a scintillator which is arranged away from a focused ion beam optical system within a vacuum chamber. If the working distance of the objective electrostatic lens 17A to the substrate 8 is too short, it becomes more difficult to separately place a structure such as a deposition gas supply nozzle near the tip of the lens barrel 16. This embodiment, however, is free from the problem because the tip portion of the lens barrel 16 has the closed-loop groove 10A for supplying the deposition gas. This makes it possible to irradiate the substrate 8 with the ion beam Ib while filling a space Sp with deposition gas. Thus, this embodiment is free from the problem that the deposition gas supply becomes difficult if the working distance is shortened.

As a result, this embodiment has shortened the working distance of the objective electrostatic lens 17A to the substrate 8, and so, it improves the efficiency of focusing the focused ion beam optical system 17, making it possible to irradiate the substrate 8 with a finely focused ion beam Ib. Further, this embodiment makes it unnecessary to alter the position of the substrate 8 upon a change from the observation mode for observing conditions of the surface 8A with the ion beam Ib to the deposition mode for deposition with CVD and vice versa because the positions of the substrate 8 for the observation and deposition mode are the same. For the foregoing reasons, this embodiment is free from the problem that the position of an area to be processed shifts as the substrate 8 moves.

Modification 1 of Second Embodiment

Figure 12:
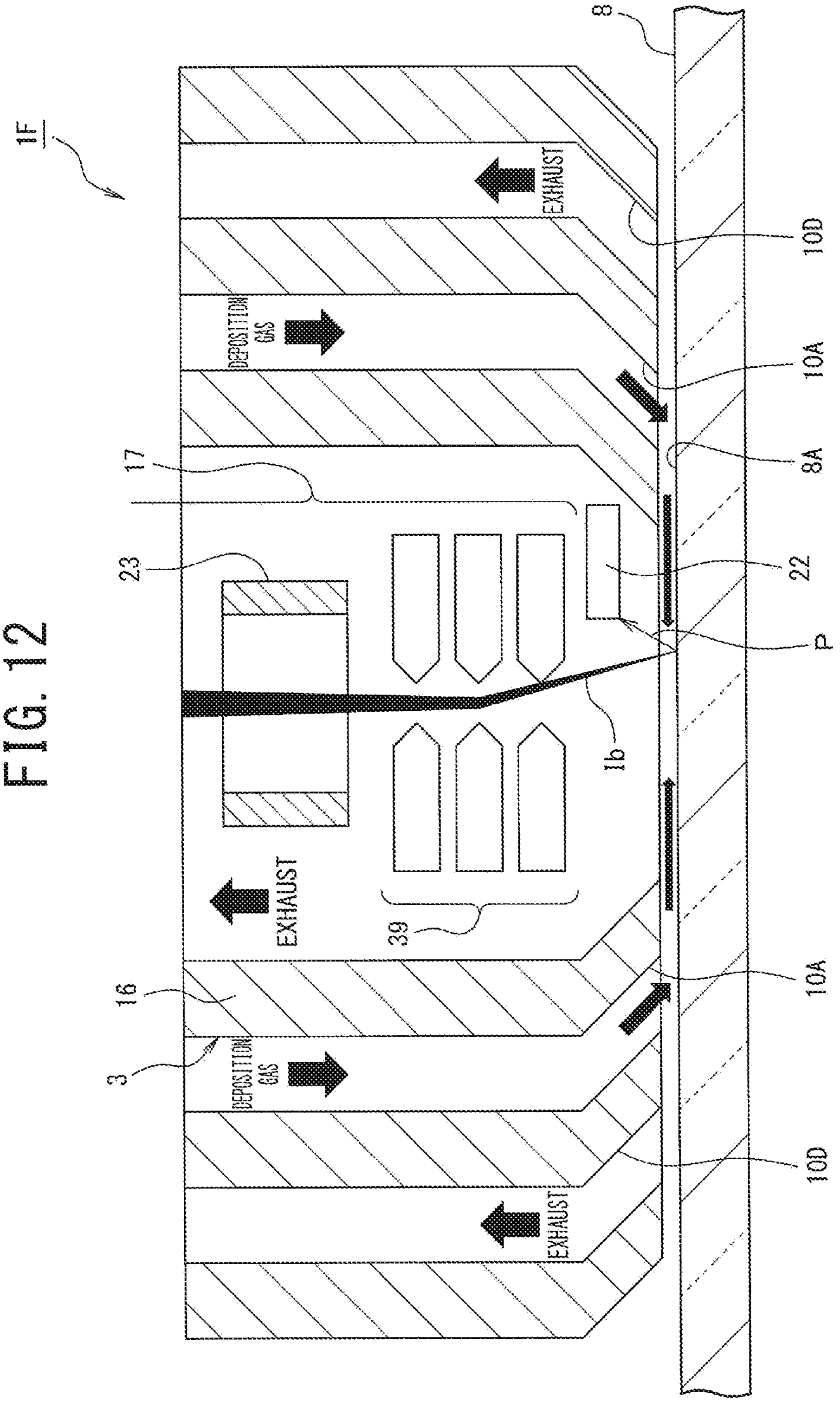
FIG. 12 is an illustration diagram schematically showing a focused ion beam system implementing a modification 1 of the second embodiment of the present invention.

As shown in FIG. 12, a focused ion beam system 1F implementing modification 1 of the second embodiment uses not the microchannel plate 21, but a detector 22 as placed laterally to an ion beam Ib and within the downstream, with respect to the flow of the ion beam Ib, area of an objective electrostatic lens 17A. Further, it uses a deflector 23 as placed within the upstream, with respect to the flow of the ion beam Ib, area of the objective electrostatic lens 17A. In this focused ion beam system 1F, the deflector 23 deflects the ion beam Ib incident on a surface 8A to be processed of a substrate 8 toward the detector 22 to hit the surface 8A at an angle to the normal in the observation mode for observing the surface 8A. Then, the detector 22 captures incident secondary charged particles P emanating from the surface 8A onto which the ion beam Ib impinges, making it possible to observe the surface conditions of the substrate 8. The detector 22 may be in the form of a scintillator. The focused ion beam system 1F is the same as the first or the second embodiment in the other aspects of its configuration.

Third Embodiment

Figure 13:
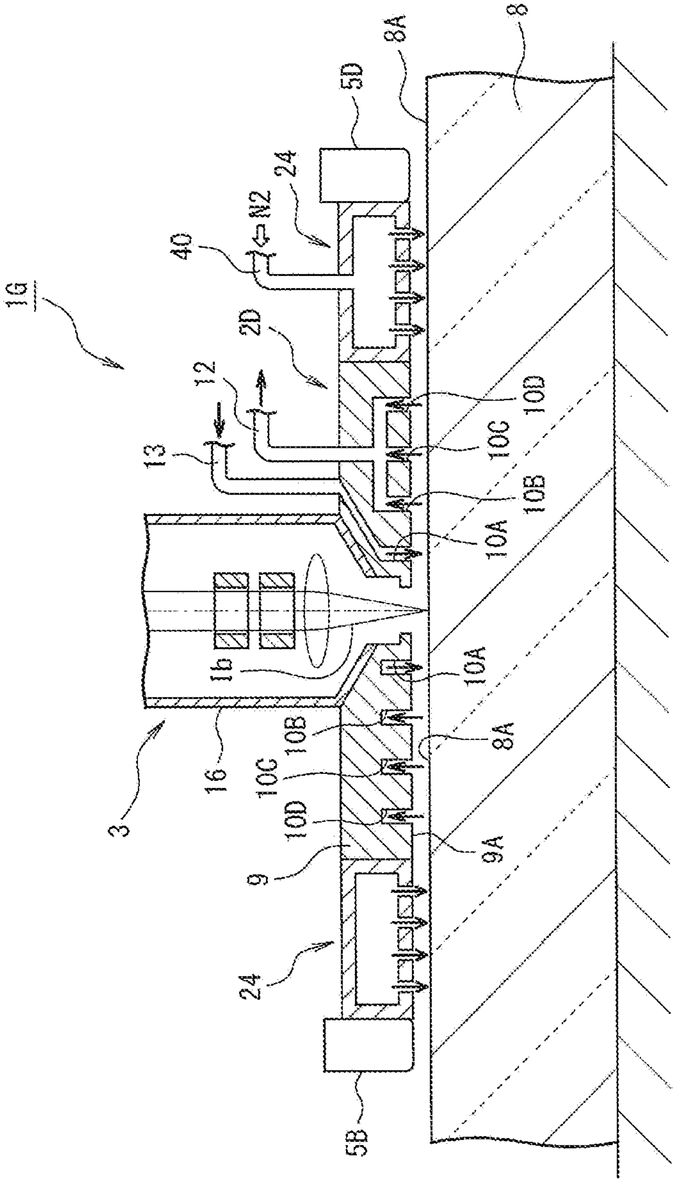
FIG. 13 is a section of a main part of a focused ion beam system according to a third embodiment of the present invention.

FIG. 13 shows a focused ion beam system 1G according to a third embodiment of the present invention. As shown in FIG. 13, the focused ion beam system 1G is equipped with a gas levitator 24, i.e., a device for levitating the surface 9A of a head 9 of a differential pumping apparatus 2D, outside the surface 9A, surrounding the entire periphery of the surface 9A, and integrated with the surface 9A. The gas levitator 24 is connected to a pump (not shown), a gas supply of inert gas in the form of nitrogen gas (N2), through a connecting tube 40. The gas levitator 24 is a closed-loop duct having a rectangular cross-section obtained when cutting the closed-loop duct with a radial plane extending from the center. The closed-loop duct has a bottom formed with discharge outlets in the form of slits or circular openings through which inert gas is blown. The gas levitator 24 has laser displacement sensors 5A, 5B, 5C, and 5D which are installed at four locations on its periphery. The focused ion beam system 1G is the same as the focused ion beam system 1 according to the first embodiment in the other aspects of its configuration.

The gas levitator 24 blows inert gas to the surface 8A to be processed to create a curtain of gas. Thus, the gas levitator 24 biases the head 9 in a direction away from the surface 8A. Using inert gas in this manner purges the inside of a lens barrel 16 with the inert gas, contributing to improvement of environment. Further, since the inert gas is blown, the head 9 is biased in the direction away from the surface 8A and rises. For this reason, this embodiment is effective to offset the vacuum created by the differential pumping operation.

Fourth Embodiment

Figure 14:
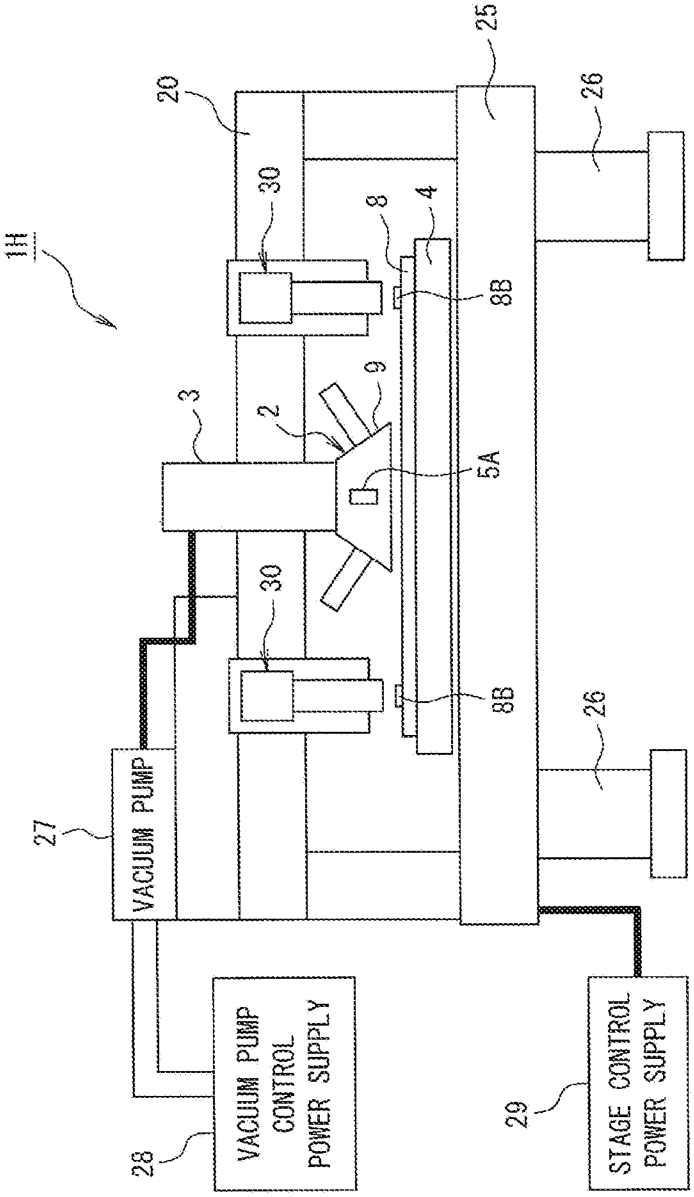
FIG. 14 is a block diagram of a focused ion beam system according to a fourth embodiment of the present invention.

FIG. 14 shows a focused ion beam system 1H according to a fourth embodiment of the present invention. The focused ion beam system 1H has an XY precision stage 25. The XY precision stage 25 has, underneath its four corners, support legs 26 for tilt adjustment, which support legs 26 serve as vertically stretchable and contractable displacement drive units. These support legs 26 are connected to a gap control unit, not shown.

A substrate support 4 movable in the X and Y axis directions is put on the XY precision stage 25. A substrate 8 to be processed, such as a photomask, is placed on the substrate support 4.

As shown in FIG. 14, a support frame 20 is built on the XY precision stage 25. At the midpoint, the support frame 20 suspends a FIB column 3. At the bottom end, the FIB column 3 is integrated with a differential pumping apparatus 2. The FIB column 3 and the differential pumping apparatus 2 are the same as those used in the before-described focused ion beam system 1 according to the first embodiment.

Connected to the FIB column 3 is a vacuum pump 27, and the vacuum pump 27 is connected to a vacuum pump control power supply 28. In addition, the XY precision stage 25 is connected to a stage control power supply 29.

In particular, in this embodiment, there are optical alignment microscopes 30, each of which is just above the corresponding one of four alignment marks 8B on the four corners of the substrate 8 placed at a predetermined position of the XY precision stage 25.

The conventional focused ion beam system has a substrate to be processed and a focused ion beam optical system inside a large vacuum chamber. In observing mode, a charged-particle detector, which is placed outside the FIB column, captures incident secondary charged electrons or secondary ions emanating from a substrate to be processed onto which the focused ion beam impinges, and the surface conditions of the substrate are observed following close examination of changes in intensity of the captured secondary charged electrons or secondary ions. Similarly, alignment is performed in vacuum by capturing incident secondary charged particles emanating from each of the alignment marks onto which the focused ion beam impinges. This alignment operation requires movement of the substrate in the vacuum chamber to place the alignment marks at the four corners of the substrate to the focused ion beam irradiation position underneath the FIB column one after another. For the required movement of the substrate, the XY precision stage has to cover about four times the area of the substrate, necessitating further increase in size of the vacuum chamber.

This embodiment is advantageous over the above-mentioned conventional focused ion beam system in that the alignment microscopes are easy to install because the differential pumping apparatus 2 has realized a localized vacuum space, and so the pressure outside the area being processed is the atmospheric pressure. According to this embodiment, the coordinates are confirmed with the relative relationship between each of the locations of the optical alignment microscopes 30 and the location at which the processing is conducted by the FIB column 3 established after conducting alignment using the alignment marks 8B at four corners of the substrate to be processed. For the foregoing reason(s), the focused ion beam system 1H according to this embodiment makes it unnecessary for the XY precision stage 25 to stroke for alignment. Moreover, the focused ion beam system 1H is effective at reducing positioning time for alignment.

Fifth Embodiment

Figure 15:
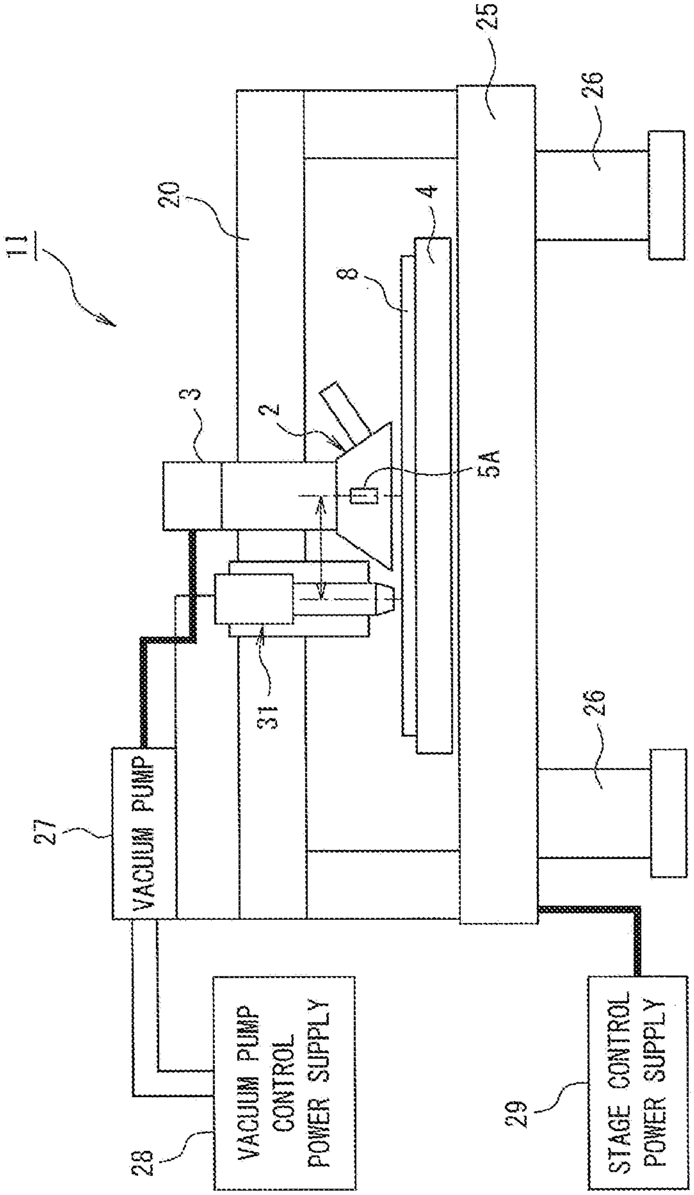
FIG. 15 is a block diagram of a focused ion beam system according to a fifth embodiment of the present invention.

FIG. 15 shows a focused ion beam system 1I according to a fifth embodiment of the present invention. The focused ion beam system 1I according to this embodiment is the same, in configuration, as the focused ion beam system 1H according to the above-described fourth embodiment. As different from the fourth embodiment, the fifth embodiment has an optical microscope 31 which is installed with an offset-distance to a FIB column 3. Although, in this embodiment, optical alignment microscopes 30 are not installed, they may be added.

In the conventional focused ion beam system, a substrate to be processed and a focused ion beam optical system are stored in a large vacuum chamber. In observing mode, a charged-particle detector, which is placed outside the FIB column, captures incident secondary charged electrons or secondary ions emanating from a substrate to be processed onto which the focused ion beam impinges, and the surface conditions of the substrate are observed as an ion image following close examination of changes in intensity of the captured secondary charged electrons or secondary ions. Ion images are used to confirm irradiation positions or the like, but the surface geometry (angle of inclination) of a substrate to be processed determines the density of secondary charged particles emanating from the substrate, and so, only surface geometry is detected as ion images. For that reason, ion images with low contrast are generated in a case of the surface geometry with less waviness, and so, irradiation positions become hard to confirm, which may cause a drop in accuracy of positioning.

As shown in FIG. 15, the focused ion beam system 1I according to this embodiment makes it unnecessary to store the entirety of a substrate 8 to be processed in a high vacuum because the differential pumping apparatus 2 locally creates a high vacuum. This allows installing the optical microscope 31 near the FIB column 3. The optical microscope 31 having a high-resolution or a laser microscope (not shown) directly obtains more information, not only the surface waviness but also color or the like, from the surface of the substrate 8 with the ion beam. For this reason, this embodiment makes it easy to confirm the right irradiation position to be processed with the ion beam.

If just the offset of the ion-beam irradiation position with respect to the position determined with the optical microscope 31 is confirmed beforehand, the substrate 8 is immediately set to the ion-beam irradiation position because what is needed is to move the substrate 8 in a direction to reduce the confirmed offset to zero following determination of the position to be processed using the optical image of the position to be processed. As described, in this embodiment, the right irradiation position is specified even on the surface of the substrate 8 which has less waviness so that the substrate 8 will be irradiated with the ion beam with high accuracy.

Sixth Embodiment

Figure 16:
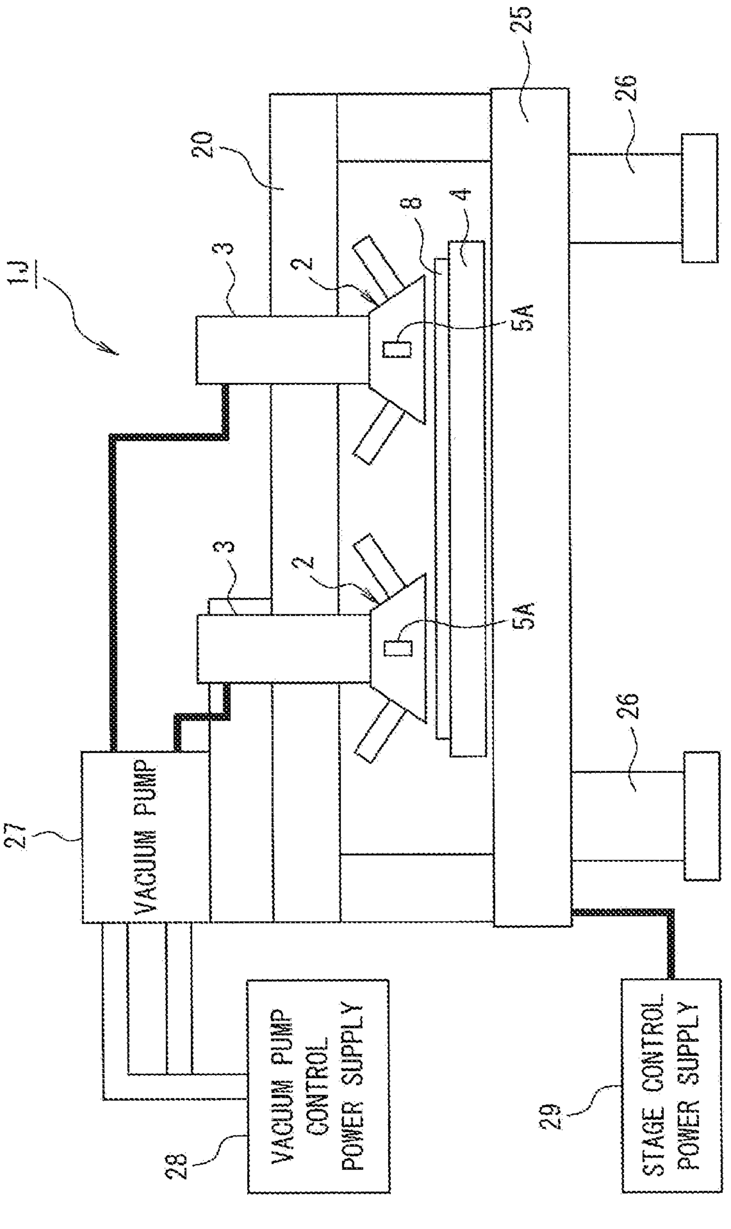
FIG. 16 is a block diagram of a focused ion beam system according to a sixth embodiment of the present invention.

FIG. 16 shows a focused ion beam system 1J according a sixth embodiment of the present invention. The focused ion beam system 1J has an XY precision stage 25, support legs 26 for tilt adjustment, which are underneath the four corners of the XY precision stage 25 and vertically stretchable and contractable, a substrate support 4, a support frame 20, four (4) FIB columns 3 suspended from the support frame 20, and differential pumping apparatuses 2, which are mounted to the bottom ends of the FIB columns 3, respectively.

Each of the FIB columns 3 is connected to a vacuum pump 27, to which a vacuum pump control power supply 28 is connected. Connected to the XY precision stage 25 is a stage control power supply 29.

In particular, this embodiment has four (4) FIB columns 3, each of which is arranged for one of four (4) regions into which a sheet of substrate 8 to be processed is divided. A stroke sufficient to cover about four times the area of one sheet of substrate 8 is conventionally needed for the substrate support 4 when treating only one sheet of substrate 8 with only one FIB column 3. Comparatively speaking, as only one sheet of substrate 8 is treated with four FIB columns 3 in this embodiment, operating the XY precision stage 25 produces a decrease in a movable stroke needed for the substrate support 4, reducing the footprint of the system to a satisfactory small level. Moreover, multiple points on the substrate are concurrently irradiated with multiple ion beams, leading to high-speed processing of the substrate.

Seventh Embodiment

Figure 17:
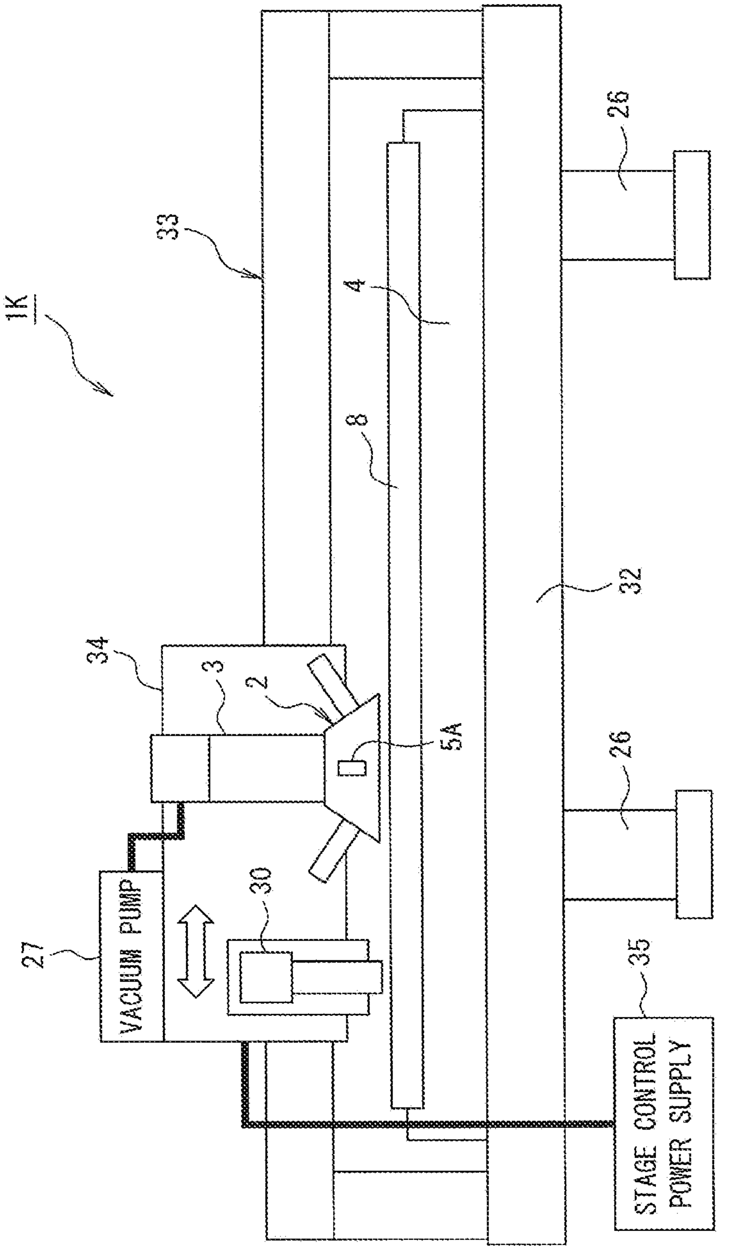
FIG. 17 is a block diagram of a focused ion beam system according to a seventh embodiment of the present invention.
Figure 18:
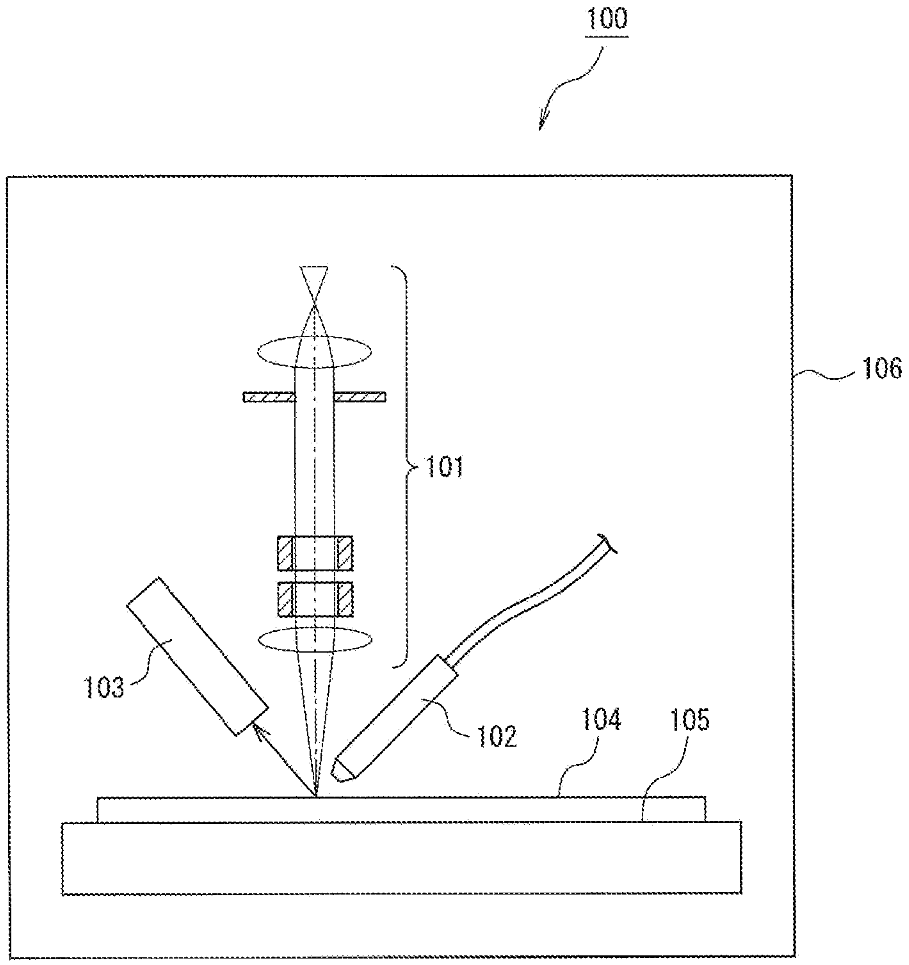
FIG. 18 is an illustration diagram of a conventional repair apparatus having a focused ion beam optical system.
Figure 19:
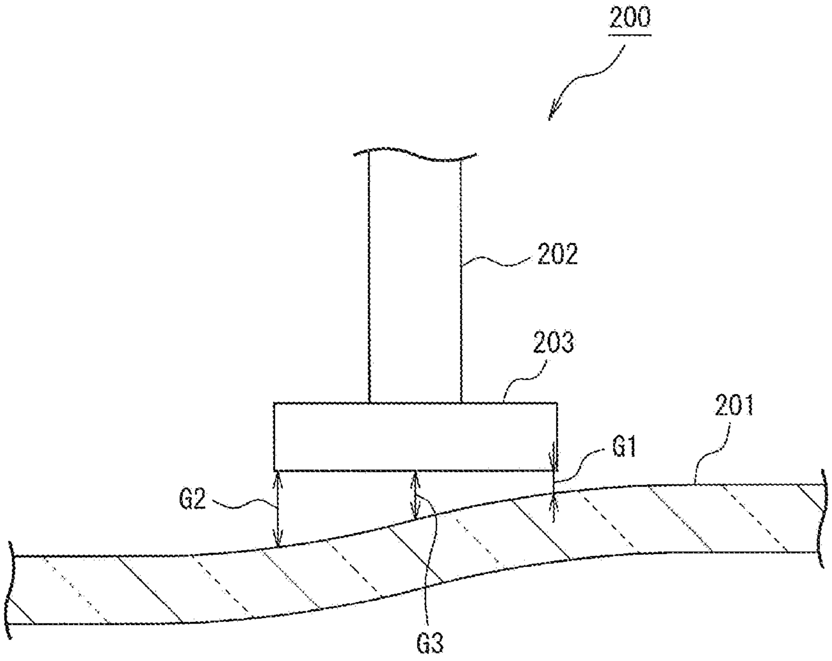
FIG. 19 is an illustration diagram showing processing to repair a large photomask with a conventional repair apparatus.

FIG. 17 shows a focused ion beam system 1K according to a seventh embodiment of the present invention. The focused ion beam system 1K has a substrate stage 32. The substrate stage 32 has, underneath its four corners, support legs 26 for tilt adjustment. The support legs 26 serve as vertically stretchable and contractable displacement drive units. These support legs 26 are connected to a gap control unit, not shown.

A substrate support 4 is put on the substrate stage 32. A substrate 8 to be processed, such as a photomask, is placed on the substrate support 4.

As shown in FIG. 17, an XY gantry stage 33 is built on the substrate stage 32. The gantry stage 33 provides XY motion of a movable block 34. A FIB column 3 and an optical alignment microscope 30 are fixed to the movable block 34. At the bottom end, the FIB column 3 is integrated with a differential pumping apparatus 2. The FIB column 3 and the differential pumping apparatus 2 are the same as those used in the before described focused ion beam system 1 according to the first embodiment.

The FIB column 3 is connected to a vacuum pump 27. The movable block 34 is connected to a stage control power supply 35.

In particular, in this embodiment, the gantry stage 33 provides XY motion of the movable block 34, and so, with the substrate 8 kept immobile, it provides XY motion of the FIB column 3 and the optical alignment microscope 30. Because the substrate 8 is immobile, the footprint of the system becomes small.

As described, in each of the embodiments according to the present invention, a differential pumping apparatus, which can sustain proper differential pumping operation even on a large substrate having warpage and/or waviness, and a focused ion beam system, which can conduct good processing, are realized.

According to the present invention, a high vacuum is maintained without fail in the space Sp for conducting processing, improving the quality of the processing conducted in the space Sp.

According to the present invention, the system is downsized, causing a reduction in capital investment and a reduction in maintenance cost as well.

According to the present invention, the gap between the outer periphery of the portion 9 and the surface 8A to be processed is made uniform to keep a face-to-face relationship between the surface 9A of the head 9 and the surface 8A of the substrate 8, preventing breakage of high vacuum conditions near the periphery of the head 9. This ensures good processing (e.g., observation, film formation) in the space Sp.

Other Embodiments

Although the embodiments of the present invention have been described, the description and drawings, which is a part of the disclosure of these embodiments, should not be understood to limit the present invention. From this disclosure, alternative embodiments, examples, and operational technology should be clear to a person skilled in the art.

With reference to a focused ion beam system applied to a repair apparatus and implementing the present invention, the foregoing embodiments of the focused charged particle beam system have been described, but they are applicable in other areas, such as electron-beam lithography systems with the feature of direct write lithography onto a substrate, scanning electron microscopes enabling observation of the surface conditions of the substrate.

In each of the above-described embodiments, the number of the closed-loop grooves formed in the differential pumping apparatus is but not limited to four. At least two, one for intake, the other for exhaust, or more closed-loop grooves suffice.

In the forgoing description about each of the above-described embodiment, the displacement drive unit takes the form of but not limited to one of the displacement drive units 6 and 6A and the tilt adjustment support legs 26, and so, the displacement drive unit may take any other means capable of adjusting the tilt and the gap.

In each of the above-described embodiments, the gap measurement devices take the form of but not limited to the laser displacement sensors 5A, 5B, 5C, and 5D, and so, the gap measurement devices may take the form of pressure gauges. In this case, estimating a true value of the tilt and a true value of the gap between the surface 9A of the head 9 and the surface 8A of the substrate 8 from measurements taken by the pressure gauges, the displacement drive unit is controlled using the estimated values.

In each of the above-described embodiments, the gap measurement devices take the form of but not limited to the laser displacement sensors 5A, 5B, 5C, and 5D, and so, the gap measurement devices may take the form of contact sensors, ultrasonic sensors, capacitive sensors, and the like. Given the measurement accuracy in the order of μm required by the differential pumping operation as in the foregoing embodiments, the displacement sensors 5A, 5B, 5C and 5D are preferred. Moreover, although four laser displacement sensors 5A, 5B, 5C, and 5D are used in the foregoing embodiments, installing gap measurement devices at least three or more locations arranged along the periphery of the head 9 suffices.

With reference to the FIB column 3 that emits ion beam Ib as energy beam, the foregoing embodiments have been described, but it is possible to apply the differential pumping apparatus to a repair apparatus or the like having a locally created vacuum zone for forming or removing wiring using irradiation with a laser beam.

REFERENCE SIGNS

Gg Real Gap
Gm Management Gap
Gos Offset Gap
Ib Ion Beam
P Secondary Charged Particle
Sp Space for Conducting Processing
1A, 1E, 1F, 1G, 1H, 1I, 1J, 1K Focused Ion Beam System (Focused Charged Particle Beam System)
2, 2A, 2B, 2C, 2D Differential Pumping Apparatus
3 Focused Ion Beam Column (FIB Column, Focused Charged Particle Beam Column)
4 Substrate Support
5A, 5B, 5C, 5D Laser Displacement Sensor (Gap Measuring Device)
6, 6A Displacement Drive Unit
7 Gap Control Unit
8 Substrate to be processed
8A Surface to be processed
8B Alignment Mark
9 Head
9A Surface Adapted to face Surface to be processed
10A Closed-loop Groove (Innermost Closed-loop Groove)
10B, 10C Closed-loop Groove
10D Closed-loop Groove (Outermost Closed-loop Groove)
11 Aperture
12, 13 Connecting Tube
14A, 14B, 14C, 14D Light-transmissive Opening
15A, 15B, 15C, 15D Transparent Light-transmissive Plate
16 Lens Barrel
17 Focused Ion Beam Optical System
17A Objective Electrostatic Lens
18 Lift Means
19 Support
20 Support Frame
21 Microchannel Plate
21A Ion Beam Passage Opening
21B Detection Unit
22 Detector
23 Deflector
24 Gas Levitator
25 XY Precision Stage
26 Support Leg for Tilt Adjustment (Displacement Drive Unit)
27 Vacuum Pump
28 Vacuum Pump Control Power Supply
29 Stage Control Power Supply
30 Optical Alignment Microscope
31 Optical Microscope
32 Substrate Stage
33 XY Gantry Stage
34 Movable Block
35 Stage Control Power Supply
40 Connecting Tube

What is claimed is:

1. A differential pumping apparatus, comprising:

a head movable relative to a surface to be processed of a substrate to be processed to face any area on the surface to be processed, the head having closed-loop grooves (10A, 10B, 10C, 10D) in its surface adapted to face the surface to be processed, each of the closed-loop grooves surrounding the center of the surface adapted to face the surface to be processed, the closed-loop grooves including an innermost closed loop-groove (10A) and other closed-loop grooves (10B, 10C, 10D), the head having, within the area surrounded by the innermost closed-loop groove (10A), an aperture defining a space for conducting processing of the surface to be processed, the innermost closed-loop groove (10A) being connectable to a deposition gas supply to deliver a deposition gas to the space for conducting processing of the surface to be processed, the closed-loop grooves including at least one closed-loop groove, selected from the other closed-loop grooves (10B, 10C, 10D), to which a vacuum pump is connectable to suck air from the one closed-loop groove to create high vacuum within the space under the condition that the surface of the head faces the surface to be processed;

a displacement drive unit configured to move the head or the surface to be processed to adjustably control the parallelism and distance between the surface to be processed and the surface of the head;

gap measurement devices placed at least three locations along the periphery of the surface of the head, each of the gap measurement devices being configured to detect the distance between the surface of the head and the surface to be processed and to provide the distance information, and a gap control unit configured to control the displacement drive unit in response to the distance information measured by each of the gap measurement devices so that the surface of the head and the surface to be processed will be parallel to each other with a predetermined distance kept therebetween.

2. The differential pumping apparatus according to claim 1, wherein each of the gap measurement devices detects pressure in the space from the gap measurement device to the surface to be processed and provides the pressure information, and the gap control unit controls the displacement drive unit in response to the pressure information.

3. The differential pumping apparatus according to claim 1, wherein the substrate to be processed has the boundary that is defined by a rectangle having its length and width lying along the X-axis and Y-axis, the head and the substrate to be processed are movable relative to each other along the X-axis and Y-axis;

the gap measurement devices are placed at four (4) locations outside the outermost closed-loop groove of the closed-loop grooves, and the gap measurement devices placed at the four locations consists of two pairs of gap measurement devices, the gap measurement devices of one of the two pairs are lined up in a row along the X-axis and separated from the center of the aperture by the same distance in opposite directions, the gap measurement devices of the other pair are lined up in a row along the Y-axis and separated from the center of the aperture by the same distance in the opposite directions.

4. The differential pumping apparatus according to claim 1, wherein each of the gap measurement units is composed of a laser displacement sensor; and the laser displacement sensor is set back from the surface of the head in a direction away from the surface to be processed to keep a distance to the surface to be processed in the high-precision measurement range in which the laser displacement sensor can work to provide measurements with good accuracy and good precision.

5. The differential pumping apparatus according to claim 1, wherein there is an optical microscope configured to detect an alignment mark on the substrate to be processed.

6. The differential pumping apparatus according to claim 1, wherein there is an observation microscope, which is installed near the head with an offset-distance, configured to observe the area to be processed on the substrate to be processed.

7. The differential pumping apparatus according to claim 1, wherein the outermost closed-loop groove among the closed-loop grooves is connected to a pump for supplying inert gas, and the inert gas is blown through the outermost closed-loop groove to the substrate to be processed to create a curtain of inert gas.

8. The differential pumping apparatus according to claim 1, wherein surrounding the entire periphery of the surface of the head, a gas levitator is located outside and integrated with the surface of the head;

the gas levitator is connected to a pump which is a supply of inert gas, and the gas levitator is configured to blow inert gas to the surface to be processed to create a curtain of gas and to bias the head in a direction away from the surface to be processed.

9. A focused charged particle beam system, comprising:

a differential pumping apparatus, including:

a head movable relative to a surface to be processed of a substrate to be processed to face any area on the surface to be processed, the head having closed-loop grooves (10A, 10B, 10C, 10D) in its surface adapted to face the surface to be processed, each of the closed-loop grooves surrounding the center of the surface adapted to face the surface to be processed, the closed-loop grooves including the innermost closed loop-groove (10A) and other closed-loop grooves (10B, 10C, 10D), the head having, within the area surrounded by the innermost closed-loop groove (10A), among the closed-loop grooves an aperture defining a space for conducting processing of the surface to be processed, the innermost closed-loop groove (10A) being connectable to a deposition gas supply to deliver a deposition gas to the space for conducting processing of the surface to be processed, the closed-loop grooves including at least one closed-loop groove, selected from the other closed-loop grooves (10B, 10C, 10D), to which a vacuum pump is connectable to suck air from the one closed-loop groove to create high vacuum within the space under the condition that the surface of the head faces the surface to be processed;

a focused energy beam column, which is on the side of the head opposite to the surface adapted to face the surface to be processed, having a lens barrel, the lens barrel having a focused energy beam system built-in for emitting a focused energy beam to pass through the aperture;

a displacement drive unit configured to move the head or the surface to be processed to adjustably control the parallelism and distance between the surface to be processed and the surface of the head;

gap measurement devices placed at least three locations along the periphery of the surface of the head, each of the gap measurement devices being configured to detect the distance between the surface of the head and the surface to be processed and to provide the distance information, and a gap control unit configured to control the displacement drive unit in response to the distance information measured by each of the gap measurement devices so that the surface of the head and the surface to be processed will be parallel to each other with a predetermined distance kept therebetween.

10. The focused charged particle beam system according to claim 9, wherein each of the gap measurement devices detects pressure in the space from the gap measurement device to the surface to be processed and provides the pressure information, and the gap control unit controls the displacement drive unit in response to the pressure information.

11. The focused charged particle beam system according to claim 9, wherein the substrate to be processed has the boundary that is defined by a rectangle having its length and width lying along the X-axis and Y-axis, the head and the substrate to be processed are movable relative to each other along the X-axis and Y-axis;

the gap measurement devices are placed at four (4) locations outside the outermost closed-loop groove of the closed-loop grooves, and the gap measurement devices placed at the four locations consists of two pairs of gap measurement devices, the gap measurement devices of one of the two pairs are lined up in a row along the X-axis and separated from the center of the aperture by the same distance in opposite directions, the gap measurement devices of the other pair are lined up in a row along the Y-axis and separated from the center of the aperture by the same distance in the opposite directions.

12. The focused charged particle beam system according to claim 9, wherein each of the gap measurement units is composed of a laser displacement sensor; and the laser displacement sensor is set back from the surface of the head in a direction away from the surface to be processed to keep a distance to the surface to be processed in the high-precision measurement range in which the laser displacement sensor can work to provide measurements with good accuracy and good precision.

13. The focused charged particle beam system according to claim 9, wherein there is an optical microscope configured to detect an alignment mark on the substrate to be processed.

14. The focused charged particle beam system according to claim 9, wherein there is an observation microscope, which is installed near the head with an offset-distance, configured to observe the area to be processed on the substrate to be processed.

15. The focused charged particle beam system according to claim 9, wherein the outermost closed-loop groove among the closed-loop grooves is connected to a pump for supplying inert gas, and the inert gas is blown through the outermost closed-loop groove to the substrate to be processed to create a curtain of inert gas.

16. The focused charged particle beam system according to claim 9, wherein surrounding the entire periphery of the surface of the head, a gas levitator is located outside and integrated with the surface of the head;

the gas levitator is connected to a pump, a supply of inert gas, and the gas levitator is configured to blow inert gas to the surface to be processed to create a curtain of gas and to bias the head in a direction away from the surface to be processed.

17. The focused charged particle beam system according to claim 9, wherein there is provided a microchannel plate which has an ion beam passage opening formed through its center, in which its peripheral portion serves as a detection unit for capturing secondary charged particles emanating from the substrate to be processed.

18. The focused charged particle energy beam system according to claim 9, wherein there are provided focused energy beam columns, each of which is the same as the focused energy beam column with the differential pumping apparatus device at its tip, each of the focused energy beam columns is arranged to face one of regions into which the substrate to be processed is divided.

19. The focused charged particle beam system according to claim 9, wherein with the substrate to be processed immobile, the XY motion of the focus energy beam with the differential pumping apparatus at its tip is provided.

* * * * *